(12) United States Patent
Noguchi et al.

(10) Patent No.: US 7,350,904 B2
(45) Date of Patent: Apr. 1, 2008

(54) PIEZOELECTRIC ELEMENT, PIEZOELECTRIC ACTUATOR, INK JET RECORDING HEAD, INK JET PRINTER, SURFACE ACOUSTIC WAVE ELEMENT, FREQUENCY FILTER, OSCILLATOR, ELECTRONIC CIRCUIT, THIN FILM PIEZOELECTRIC RESONATOR, AND ELECTRONIC APPARATUS

(75) Inventors: Motohisa Noguchi, Suwa (JP); Eiju Hirai, Nagano-ken (JP)

(73) Assignee: Seiko Epson Corporation (JP)

( * ) Notice: Subject to any disclaimer, the term of this patent is extended or adjusted under 35 U.S.C. 154(b) by 347 days.

(21) Appl. No.: 11/043,029

(22) Filed: Jan. 25, 2005

(65) Prior Publication Data

US 2005/0185026 A1 Aug. 25, 2005

(30) Foreign Application Priority Data

Jan. 26, 2004 (JP) ............................. 2004-017108

(51) Int. Cl.
*B41J 2/45* (2006.01)

(52) U.S. Cl. .......................................... 347/72; 347/68

(58) Field of Classification Search .................. 347/72, 347/68

See application file for complete search history.

(56) References Cited

U.S. PATENT DOCUMENTS

| | | |
|---|---|---|
| 5,453,294 A | 9/1995 | Ogi et al. |
| 6,111,284 A | 8/2000 | Sakurai |
| 6,142,615 A * | 11/2000 | Qiu et al. ..................... 347/70 |
| 6,347,862 B1 | 2/2002 | Kanno et al. |
| 6,853,021 B2 | 2/2005 | Sakurai et al. |
| 7,033,521 B2 * | 4/2006 | Iwashita et al. ....... 252/62.9 R |
| 2005/0018019 A1 * | 1/2005 | Miyazawa et al. ............ 347/68 |
| 2005/0140743 A1 * | 6/2005 | Miyazawa et al. ............ 347/68 |
| 2005/0179342 A1 | 8/2005 | Higuchi |

FOREIGN PATENT DOCUMENTS

| | | |
|---|---|---|
| CN | 1215253 | 4/1999 |
| CN | 1336718 | 2/2002 |
| CN | 1380187 | 11/2002 |
| EP | 1 367 658 | 3/2003 |
| JP | 06-125038 | 5/1994 |
| JP | 07-099252 | 4/1995 |
| JP | 2001-223404 | 8/2001 |
| JP | 2001-313526 | 11/2001 |
| JP | 2002-234156 | 8/2002 |
| JP | 2004-080833 | 3/2004 |

OTHER PUBLICATIONS

Communication from Chinese Patent Office regarding counterpart application.

* cited by examiner

*Primary Examiner*—Stephen Meier
*Assistant Examiner*—Sarah Al-Hashimi
(74) *Attorney, Agent, or Firm*—Harness, Dickey & Pierce, P.L.C.

(57) ABSTRACT

A piezoelectric element is provided that is equipped with a seed layer formed on a base substrate and a piezoelectric film formed on the seed layer. The seed layer is formed of a perovskite type piezoelectric material preferentially oriented to pseudo cubic (100). The piezoelectric film is formed of a relaxor material that has a perovskite type rhombohedral structure, and is preferentially oriented to pseudo cubic (100).

10 Claims, 12 Drawing Sheets

TRANSMITTER 80,
TRANSMISSION SIGNAL
PROCESSING CIRCUIT 81,
TRANSMISSION MIXER 82,
TRANSMISSION FILTER 83,
TRANSMISSION POWER
AMPLIFIER 84,
TRANSCEIVER WAVE DIVIDER 85,
ANTENNAS 86a, 86b,
LOW NOISE AMPLIFIER 87,
RECEPTION FILTER 88,
RECEPTION MIXER 89,
RECEPTION SIGNAL PROCESSING
CIRCUIT 90,
RECEIVER 91,
FREQUENCY SYNTHESIZER 92,
CONTROL CIRCUIT 93, and
IPUT/DISPLAY CIRCUIT 94

PIEZOELECTRIC ELEMENT, PIEZOELECTRIC ACTUATOR, INK JET RECORDING HEAD, INK JET PRINTER, SURFACE ACOUSTIC WAVE ELEMENT, FREQUENCY FILTER, OSCILLATOR, ELECTRONIC CIRCUIT, THIN FILM PIEZOELECTRIC RESONATOR, AND ELECTRONIC APPARATUS

RELATED APPLICATIONS

This application claims priority to Japanese Patent Application No. 2004-017108 filed Jan. 26, 2004 which is hereby expressly incorporated by reference herein in its entirety.

BACKGROUND

1. Technical Field

The present invention relates to piezoelectric elements, piezoelectric actuators, ink jet recording heads, ink jet printers, surface acoustic wave elements, frequency filters, oscillators, electronic circuits, thin film piezoelectric resonators, and electronic apparatuses, which have piezoelectric films.

2. Related Art

An inkjet printer is known as a printer that enables a high resolution picture quality and a high-speed printing. An inkjet printer is equipped with an ink jet recording head that has a cavity whose volume changes. Ink droplets are discharged from its nozzle while scanning the head, whereby printing is performed. As a head actuator in the ink jet recording head for such an inkjet printer, a piezoelectric element that uses a piezoelectric film, which is represented by PZT (Pb (Zr, Ti) $O_3$), is conventionally used (see, for example, Japanese Laid-open Patent Application 2001-223404).

Moreover, because the characteristics of surface acoustic wave elements, frequency filters, oscillators, and electronic circuits are desired to be improved, excellent products with novel piezoelectric materials are expected to be supplied.

It is noted that higher picture quality and faster printing speed are in demand in inkjet printers. To meet such a demand, the technology to make nozzles in an ink jet recording head to have a higher density becomes indispensable. In order to achieve this, piezoelectric elements (head actuators) that are laminated over cavities, and in particular, the characteristics of piezoelectric films, in other words, their piezoelectric constant need to be improved.

The present invention has been made in view of the problems described above, and its object is to provide piezoelectric elements equipped with piezoelectric films having a high piezoelectric constant, and to provide piezoelectric actuators, ink jet recording heads, ink jet printers, surface acoustic wave elements, frequency filters, oscillators, electronic circuits, thin film piezoelectric resonators, and electronic apparatuses, which use the piezoelectric films.

SUMMARY

To achieve the object described above, a piezoelectric element in accordance with the present invention is equipped with a seed layer formed on a base substrate and a piezoelectric film formed on the seed layer, and is characterized in that the seed layer is formed of a perovskite type piezoelectric material preferentially oriented to pseudo cubic (100), and the piezoelectric film is formed of a relaxor material of a perovskite type that is preferentially oriented to pseudo cubic (100).

Or, a piezoelectric element is equipped with a seed layer formed on a base substrate and a piezoelectric film formed on the seed layer, and is characterized in that the seed layer is formed of a perovskite type piezoelectric material preferentially oriented to pseudo cubic (100), and the piezoelectric film is formed of a relaxor material of a perovskite type having a rhombohedral structure, that is preferentially oriented to pseudo cubic (100).

The seed layer may preferably be formed of $Pb(ZrTi)O_3$.

Or, the seed layer may preferably be composed of a plurality of layers, wherein a composition of each layer among the plurality of layers may be different from one another.

Or, the seed layer may preferably be composed of a plurality of layers, wherein a lowermost layer among the plurality of layers may be a $PbTiO_3$, and a layer formed over the lowermost layer may be a $Pb(ZrTi)O_3$.

Also, the relaxor material may preferably be formed of at least one type among materials shown by the following formulae:

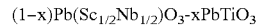

(where, x is 0.10<x<0.42)

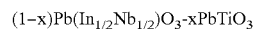

(where, x is 0.10<x<0.37)

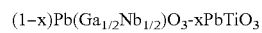

(where, x is 0.10<x<0.50)

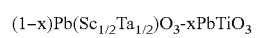

(where, x is 0.10<x<0.45)

(where, x is 0.10<x<0.35)

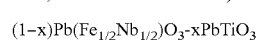

(where, x is 0.01<x<0.10)

(where, x is 0.01<x<0.09.)

(where, x is 0.10<x<0.38)

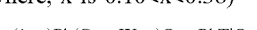

(where, x is 0.10<x<0.42).

According to the piezoelectric element, because the piezoelectric film formed of a relaxor material is formed on the seed layer that is preferentially oriented to (100), the piezoelectric film also becomes preferentially oriented to pseudo cubic (100), such that it has a high piezoelectric constant, and exhibits a larger deformation to an applied voltage.

Also, by using a relaxor material shown by each of the formulae described above as a piezoelectric film, its piezoelectric constant becomes sufficiently high, and the piezoelectric film exhibits a better deformation.

It is noted that the case of "being preferentially oriented" includes a case where most of the crystals (for example, 90% or more) are in a desired (100) orientation, and the remaining crystals are in another orientation (for example, (111) orientation), and also includes a case where 100% of the crystals are in a desired (111) orientation.

Moreover, in an ink jet recording head equipped with a cavity having a volume that changes, the piezoelectric element described above may change the volume of the cavity by a deformation of the piezoelectric film.

By providing the piezoelectric element (as a head actuator) in the ink jet recording head, ink can be excellently discharged by its excellent piezoelectric characteristics.

A piezoelectric actuator in accordance with the present invention is characterized in comprising the piezoelectric element described above. The piezoelectric actuator excellently functions due to the piezoelectric characteristics described above.

An ink jet recording head in accordance with the present invention pertains to an ink jet recording head having a cavity having a volume that changes, and is characterized in comprising the piezoelectric element described above as a piezoelectric element that changes the volume of the cavity by a deformation of a piezoelectric film.

By the ink jet recording head, ink can be excellently discharged by the excellent piezoelectric characteristics described above. Also, in particular, because the piezoelectric film has a high piezoelectric constant and exhibits a greater deformation to an applied voltage, the cavity area (volume) required to discharge a predetermined amount of ink can be smaller compared to the conventional system, and therefore nozzles can be arranged in a higher density.

An ink jet printer in accordance with the present invention is characterized in comprising the ink jet recording head described above.

Because the ink jet printer is equipped with an ink jet recording head that has a high performance and whose nozzles can be arranged in a high density, a high-speed printing becomes possible.

A surface acoustic wave element in accordance with the present invention is characterized in comprising the piezoelectric element recited above formed on a substrate.

According to the surface acoustic wave element, the piezoelectric film of the piezoelectric element has excellent piezoelectric characteristics, such that the surface acoustic wave element itself has a high performance.

A frequency filter in accordance with the present invention is characterized in comprising: a first electrode that is formed on the piezoelectric film of the surface acoustic wave element described above; and a second electrode that is formed on the piezoelectric film, resonates at a specified frequency or a specified band frequency in surface acoustic waves generated in the piezoelectric film by an electrical signal applied to the first electrode, and converts the same to an electrical signal.

According to the frequency filter, its piezoelectric film has excellent piezoelectric characteristics and therefore the piezoelectric film has a high electromechanical coupling factor, such that its specific bandwidth is wide and excellent.

An oscillator in accordance with the present invention is characterized in comprising: an oscillation circuit including an electrical signal application electrode that is formed on the piezoelectric film of the surface acoustic wave element described above, and generates surface acoustic waves in the piezoelectric film by an electrical signal applied; and a resonation electrode that is formed on the piezoelectric film, and resonates at a specified frequency or a specified band frequency in the surface acoustic waves generated by the electrical signal application electrode, and transistors.

According to the oscillator, because the piezoelectric film has excellent piezoelectric characteristics, and therefore the piezoelectric film has a high electromechanical coupling factor, such that extension coils can be omitted, and thus the circuit structure becomes simple. Also, because it is equipped with the oscillation circuit formed from transistors and the like, it can be miniaturized through integration of the transistors.

An electronic circuit in accordance with the present invention is equipped with the oscillator described above, and an electrical signal supplying element that applies the electrical signal to the electrical signal application electrode provided in the oscillator, and is characterized in comprising the functions to select a specified frequency component from frequency components of the electrical signal or convert the frequency components to a specified frequency, or to give a predetermined modulation to the electrical signal to conduct a predetermined demodulation or conduct a predetermined detection.

Accordingly, because the piezoelectric film composing the surface acoustic wave element provided in the oscillator has excellent piezoelectric characteristics, and therefore the piezoelectric film has a high electromechanical coupling factor, the electronic circuit can be integrated with an oscillation circuit, such that it becomes smaller in size and higher in performance.

A thin film piezoelectric resonator in accordance with the present invention is characterized in comprising a resonator that is formed from the piezoelectric element described above on a base substrate.

Because the piezoelectric film of the resonator has a high electromechanical coupling factor, the thin film piezoelectric resonator can be used in a high-frequency area, such as, for example, a GHz band.

It is noted that, with such a thin film piezoelectric resonator, a via hole may be formed on an opposite side of the side of the base substrate where the resonator described above is formed, whereby a diaphragm type thin film piezoelectric resonator can be formed.

Also, by forming an air gap between the base substrate and the resonator, an air gap type thin film piezoelectric resonator can be formed.

An electronic apparatus in accordance with the present invention is characterized in comprising at least one of the above-described frequency filter, oscillator, electronic circuit, and thin film piezoelectric resonator.

Because the piezoelectric film has excellent piezoelectric characteristics, and therefore the piezoelectric film has a high electromechanical coupling factor, the electronic apparatus becomes miniaturized and has a higher performance.

DETAILED DESCRIPTION

The present invention is described in detail below.

Piezoelectric Element

First, a piezoelectric element in accordance with the present invention that is obtained by a method for manufacturing a ferroelectric thin film in accordance with the present invention is described.

Figure 1:
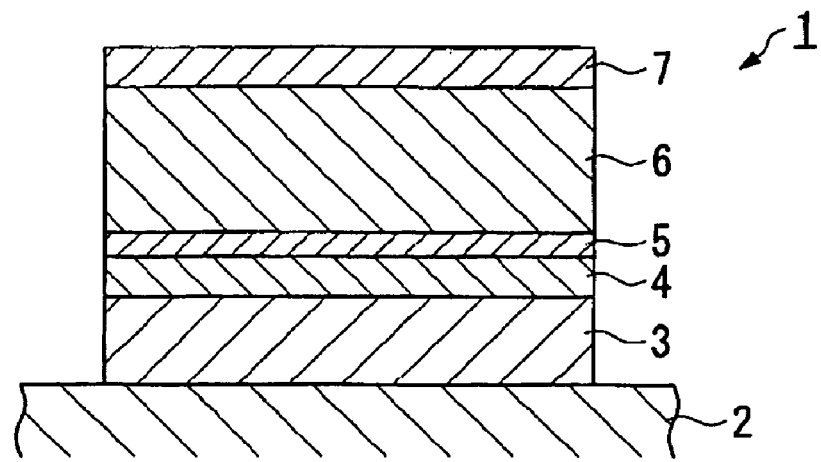
FIG. 1 is a cross-sectional view showing a piezoelectric element in accordance with an embodiment of the present invention.

FIG. 1 is a view showing an embodiment in which a piezoelectric element of the present invention is applied to a piezoelectric element that becomes to be a head actuator, in particular, for an ink jet recording head, wherein reference numeral 1 in FIG. 1 denotes a piezoelectric element.

Also, the piezoelectric element can be used as a piezoelectric actuator other than as the head actuator for an ink jet recording head.

The piezoelectric element 1 is formed on a substrate 2 formed of silicon (Si), and has a structure having an elastic film 3 formed on the substrate 2, a lower electrode 4 formed on the elastic film 3, a seed layer 5 formed on the lower electrode 4, a piezoelectric film 6 formed on the seed layer 5, and an upper electrode 7 formed on the piezoelectric film 6. It is noted here that, in the present invention, a portion from the substrate 2 up to the lower electrode 4 is referred to as a base substrate.

It is noted that, as the substrate 2, a single-crystal silicon substrate with a (100) orientation, a single-crystal silicon substrate with a (111) orientation, or a Si substrate with a (110) orientation can be used. Also, a substrate having an amorphous oxide silicon film such as a thermal oxidation film, a natural oxidation film or the like formed on its surface can be used.

The elastic film 3 formed on the substrate 2 is a film that functions as an elastic plate in the piezoelectric element that becomes a head actuator for an inkjet recording head, is formed of $SiO_2$, $ZrO_2$ or the like, and is thickly formed to a thickness of, for example, about 1 μm. It is desirable to form the elastic film 3 with a material that can take a sufficient selection ratio with Si such as $SiO_2$ and $ZrO_2$ described above, such that the elastic film 3 functions as an etching stopper layer when a cavity is formed here by etching the substrate 2 as described below. It is noted that, when multiple piezoelectric elements are formed on the substrate 2 that becomes an ink chamber substrate in the inkjet recording head to be described below, the elastic film 3 can be formed as a common elastic plate for them.

The lower electrode 4 becomes to be one of electrodes for applying a voltage to the piezoelectric film 6, and is formed, for example, in the same size as that of the piezoelectric film 6 as indicated in FIG. 1, in other words, in the same configuration as that of the upper electrode 7. It is noted that, when multiple piezoelectric elements are formed on the substrate 2 that becomes an ink chamber substrate in the inkjet recording head to be described below, the lower electrode 4 can be formed in the same size as the elastic film 3 that defines a common elastic plate, so as to function as a common electrode for them. Furthermore, the lower electrode 4 is formed from Pt (platinum), Ir (iridium), $IrO_x$ (iridium oxide), Ti (titanium) or the like, to a thickness of about 100 nm-200 nm.

The seed layer 5 is formed of a piezoelectric material of a perovskite type and is preferentially oriented to pseudo cubic (100). More specifically, as a lead system material, lead titanate ($PbTiO_3$), PZT (Pb $(Zr_xTi_y)O_3$; x+y=1), (Pb $(Zr_xTi_yM_z)O_3$; M=Nb, Ta, V, x+y+z=1), and other lead titanate derivatives can be enumerated. As a non-lead system material, $BaTiO_3$, $(Ba_aA_b)$ $(M_xTi_y)O_3$ (A=Sr, Ca, a+b=1, M=Zr, Hf, x+y=1), and the like are enumerated. These piezoelectric materials can be formed into a film on the lower electrode 4 by a liquid phase method or a vapor phase method, and can be preferentially oriented to pseudo cubic (100) by appropriately controlling, in particular, the temperature condition (heating condition) in this instance. It is noted here that the case of "being preferentially oriented" includes a case in which most of the crystals are oriented to a desired (100) orientation and the rest is oriented to other orientations, as described above. When most of the crystals are oriented to a desired (100) orientation, the piezoelectric film 6, when the piezoelectric film 6 is formed thereon as described below, succeeds the crystal structure of the seed layer 5, and has the same crystal structure, in other words, is preferentially oriented to (100).

Because the seed layer 5 is formed of a piezoelectric material, it does not function as the lower electrode 4 but rather slightly demonstrates a function as the piezoelectric film 6 as described below, and it influences the piezoelectric characteristics (helps the piezoelectric characteristics) of the piezoelectric film 6. Therefore, if the film thickness of the seed layer 5 becomes too large, the influence of the piezoelectric film 6 on the piezoelectric characteristics becomes too large. Therefore, the thickness of the seed layer may preferably be 100 nm or less, and more preferably, 50 nm or less, such that the influence does not grow more than necessary. Also, a typical film thickness of the piezoelectric film 6 is 300 nm to 3.0 μm. The upper limit of the thickness is not limited, as long as it is within the range to sustain the density and the crystal orientation as a thin film, and may be allowed up to 10 μm.

The piezoelectric film 6 is formed from a relaxor material that has a perovskite type rhombohedral structure, and preferentially oriented to pseudo cubic (100), and is formed to a thickness of about 500 nm-1000 nm. As the relaxor material, for example, materials shown by the following formulae can be enumerated. One type or multiple types selected from among these materials is formed into a film by a liquid phase method or a vapor phase method, whereby the piezoelectric film 6 can be obtained.

$(1-x)Pb(Sc_{1/2}Nb_{1/2})O_3\text{-}xPbTiO_3$ (where, x is 0.10<x<0.42, more preferably, 0.20<x<0.42)

$(1-x)Pb(In_{1/2}Nb_{1/2})O_3\text{-}xPbTiO_3$ (where, x is 0.10<x<0.37, more preferably, 0.20<x<0.37)

$(1-x)Pb(Ga_{1/2}Nb_{1/2})O_3\text{-}xPbTiO_3$ (where, x is 0.10<x<0.50, more preferably, 0.30<x<0.50)

$(1-x)Pb(Sc_{1/2}Ta_{1/2})O_3\text{-}xPbTiO_3$ (where, x is 0.10<x<0.45, more preferably, 0.20<x<0.45)

$(1-x)Pb(Mg_{1/3}Nb_{2/3})O_3\text{-}xPbTiO_3$ (where, x is 0.10<x<0.35, more preferably, 0.20<x<0.35)

$(1-x)Pb(Fe_{1/2}Nb_{1/2})O_3\text{-}xPbTiO_3$ (where, x is 0.01<x<0.10, more preferably, 0.03<x<0.10)

$(1-x)Pb(Zn_{1/3}Nb_{2/3})O_3\text{-}xPbTiO_3$ (where, x is 0.01<x<0.09, more preferably, 0.03<x<0.09)

$(1-x)Pb(Ni_{1/3}Nb_{2/3})O_3\text{-}xPbTiO_3$ (where, x is 0.10<x<0.38, more preferably, 0.20<x<0.38)

$(1-x)Pb(Co_{1/2}W_{1/2})O_3\text{-}xPbTiO_3$ (where, x is 0.10<x<0.42, more preferably, 0.20<x<0.42).

Figure 2:
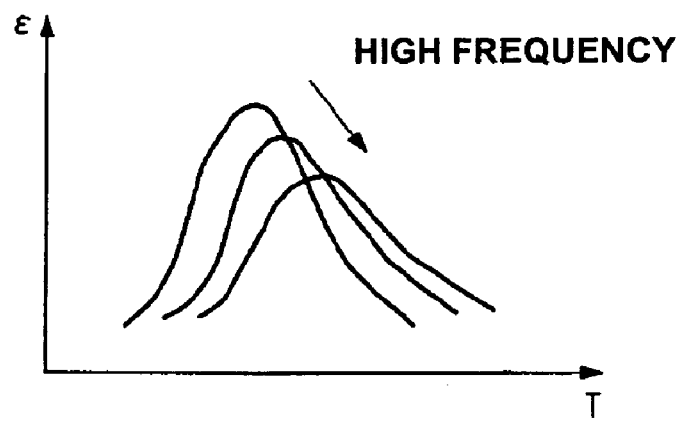
FIGS. 2(a) and (b) are graphs for describing relaxor materials
Figure 2:
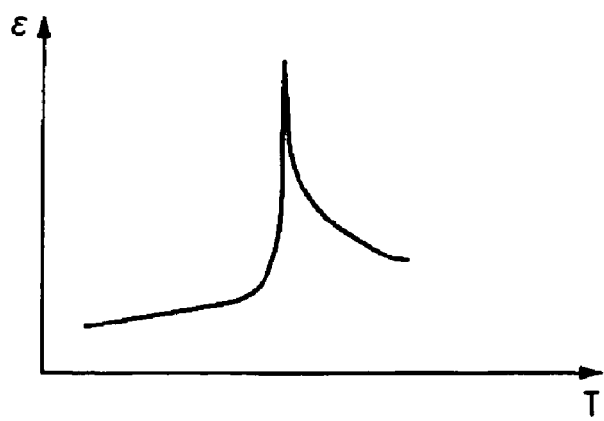

It is noted here that a relaxor material is a material whose temperature-dependence of dielectric constant exhibits a broad (wide) peak as indicated in FIG. 2(a), and in which the temperature at which its dielectric constant becomes maximum shifts according to frequencies measured. Also, its temperature dependence of piezoelectric constant concurrently exhibits a broad (wide) peak. In contrast, in a piezoelectric material such as PZT, which is a non-relaxor material, its temperature dependence of dielectric constant and piezoelectric constant exhibit a very sharp peak as indicated in FIG. 2(b). Accordingly, by using a relaxor material for the piezoelectric film 6, the piezoelectric element 1 obtained exhibits excellent piezoelectric characteristics in a broad temperature range, whereby its reliability becomes high and its characteristics becomes stable.

Moreover, the piezoelectric film 6 has a rhombohedral structure of a perovskite type, and is preferentially oriented to pseudo cubic (100), which is coordinated in an engineered domain, and therefore has a high piezoelectric constant ($d_{31}$). It is noted here that the case of "being preferentially oriented" includes a case in which most of the crystals are oriented to a desired pseudo cubic (100) orientation, but the rest is oriented to other orientations, as described above. In other words, because the piezoelectric film 6 is formed on the seed layer 5 that is preferentially oriented, and thus has a crystal structure that succeeds the crystal structure of the seed layer 5, the piezoelectric film 6 is preferentially oriented to (100), like the seed layer 5.

In the material that forms the piezoelectric film 6 (relaxor material), as for the aforementioned range of x indicating the composition ratio among the materials on the $PbTiO_3$ (PT) side, in particular, its upper limit is assumed to be a value indicating a composition ratio of the $PbTiO_3$ (PT) side at its morphotropic phase boundary (MPB), in other words, at which a phase change takes place between rhombohedral structure and tetragonal structure. The value x is assumed to range from a value smaller than the composition ratio at the phase change to a value at which the phase becomes the rhombohedral structure. It is noted here that the d constant ($d_{31}$), that is a piezoelectric constant, becomes to be the maximum value around the morphotropic phase boundary (MPB). Accordingly, as the lower limit value of the value x, a value close to the value x at the MPB is selected. Therefore, although relatively small values are permissible in the range of x for achieving the present invention, values in the preferred range, in other words, values that are close to the value x at the MPB, may be selected in order to obtain a higher d constant ($d_{31}$), i.e., higher piezoelectric constant.

Conventionally, a complex technique is required to form the piezoelectric layer 6, which is formed of a relaxor material that has a perovskite type rhombohedral structure and is preferentially oriented to pseudo cubic (100). For example, a buffer layer is formed by using a laser ablation method, together with a complex technique such as an ion beam assisted method, a groundwork is formed thereon by forming a lower electrode of a perovskite type, and then a piezoelectric film is formed over the groundwork. The reason to adopt such a technique is that the manufacturing margin to form a dense thin film of a relaxor material on a conventional electrode material such as Pt and Ir is small, while a dense thin film can be relatively easily obtained on an electrode of a perovskite type material such as $SrRuO_3$, and to control the orientation of the $SrRuO_3$ electrode, the laser ablation method and the ion beam assisted method are needed. However, there is a difficulty in that such a technique involves complicated processes, such that the cost is raised and piezoelectric characteristics of the piezoelectric film obtained are not stable enough. PZT and $BaTiO_3$ can form a dense thin film on a Pt or Ir electrode, with its orientation being controlled to some degree. In addition, a relaxor material such as PMN•PT can be readily laminated as a dense thin film on a dense PZT and $BaTiO_3$ layer that is once formed. Therefore, in the present invention, the seed layer 5 that is formed of PZT or the like is formed beforehand as described above, and the piezoelectric film 6 that is formed of a relaxor material is formed thereon, whereby the piezoelectric film 6 with excellent piezoelectric characteristics can be readily formed even by a liquid phase method that involves simpler processes compared to a vapor phase method, as described below.

The upper electrode 7 becomes the other electrode to apply a voltage to the piezoelectric film 6, and is formed of, for example, Pt (platinum), Ir (iridium), $IrO_x$ (iridium oxide), Ti (titanium), $SrRuO_3$ or the like, like the lower electrode 4, which is formed to a thickness of about 100 nm.

It is noted that the use of a perovskite electrode such as a $SrRuO_3$ electrode as the lower electrode 4 does not deviates from the subject matter of the present invention. If a seed layer such as PZT is placed between the lower electrode 4 formed of $SrRuO_3$ and the piezoelectric film 6 formed of a relaxor material, the pseudo cubic (100) orientation of the piezoelectric film 6 can be more readily controlled in the manufacturing process.

Next, a method for manufacturing the piezoelectric element 1 having such a structure is described.

First, as a substrate 2, a single-crystal Si substrate with a (110) or (100) orientation, a single-crystal Si substrate with a (111) orientation, or a Si substrate with a (100) or (110) orientation with an amorphous silicon oxide film that is a natural oxidation film formed thereon is prepared.

Next, an elastic film 3 is formed on the substrate 2 as shown in FIG. 3(a). For the elastic film 3, a vapor phase method such as a CVD method, a sputter method, or the like is properly decided and adopted according to the material to be formed.

Next, a lower electrode 4 that is formed of Pt, for example, is formed on the elastic film 3, as shown in FIG. 3(b). Because this Pt relatively readily becomes preferentially oriented to (111), it can be readily oriented and grown on the elastic film 3 by using, for example, a relatively simple method such as a sputter method or the like.

Next, a seed layer 5 is formed on the lower electrode 4, as shown in FIG. 3(c). More specifically, a precursor solution of the perovskite type piezoelectric material described above is disposed on the lower electrode 4 by a well-known coating method, such as, a spin coat method, a droplet discharge method, or the like, and then a heat-treatment such as sintering or the like is conducted to thereby obtain the seed layer 5. Concretely, a series of steps of a precursor solution coating step, a dry thermal treatment step, and a cleaning thermal treatment step is repeated a desired number of times depending on the desired film thickness, and then crystallization annealing is conducted to form the seed layer 5. Conditions in each of the steps are for example as follows.

In the precursor solution coating step, if the precursor solution is coated by a spin coat method, first, the precursor solution is dripped on the lower electrode 4. In order to spread the dripped solution over the entire surface of the substrate, spinning is conducted. The rotation speed of the spinning may be, for example, about 500 rpm in an initial stage, and can be increased in succession to about 2000 rpm such that coating irregularities do not occur, and then the coating is completed.

In the dry thermal treatment step, a heat treatment (dry treatment) is performed in the atmosphere, using a hot plate or the like, at temperatures that are about 10° C. higher than the boiling point of the solution used in the precursor solution, for example.

In the cleaning thermal treatment step, a heat treatment is performed in the atmosphere, using a hot plate, at about 350° C. to dissolve and remove ligands of the organic metals used in the precursor solution.

In crystallization annealing, in other words, in the sintering step for crystallization, a thermal treatment is performed in an oxygen atmosphere, at about 600° C., for example, by using the rapid thermal anneal (RTA) method or the like.

By forming the seed layer 5 on the lower electrode 4 formed of Pt with a (111) orientation in the manner described above, a perovskite structure type piezoelectric is formed in a state preferentially oriented to (100).

Next, as shown in FIG. 3(d), a piezoelectric film 6 is formed on the seed layer 5. More specifically, a precursor solution of the relaxor material described above is disposed on the seed layer 5 by a well-known coating method, such as, a spin coat method, a droplet discharge method, or the like, and then a heat-treatment such as sintering or the like is conducted to thereby obtain the piezoelectric film 6. Concretely, in a manner similar to the case of forming the seed layer 5, a series of steps of a precursor solution coating step, a solution removal step, a dry thermal treatment step, and a cleaning thermal treatment step is repeated a desired number of times depending on the desired film thickness, and then crystallization annealing is conducted to form the piezoelectric film 6. Conditions in each of the steps are generally the same as those in forming the seed layer 5.

The piezoelectric film 6 thus formed, as being formed on the seed layer 5 that is preferentially oriented to (100), succeeds the crystal structure of the seed layer 5, in other words, the orientation thereof, and would have the same crystal structure, in other words, preferentially oriented to psuedo cubic (100).

The precursor solution that is the forming material of the seed layer 5 or the piezoelectric film 6 is formed as follows.

Organic metals that include constituent metals of the piezoelectric material or the relaxor material, respectively, that becomes the seed layer 5 or the piezoelectric film 6, in other words, the organic metals such as metal alkoxide and organic acid salt are mixed such that each of the metals becomes a desired molar ratio, and they are dissolved or dispersed by using an organic solvent such as alcohol. A variety of additives, such as, stabilization agent may be added to this precursor solution if necessary. In addition, when hydrolysis or polycondensation is to be caused in the solution, acid or base can be added to the solution as a catalyst with an appropriate amount of water.

In the present embodiment, the seed layer 5 as well as the piezoelectric film 6 is formed by a liquid phase method, but the seed layer 5 and the piezoelectric film 6 can be formed by using a vapor phase method such as a laser ablation method, a sputter method or the like.

Then, as shown in FIG. 3(e), an upper electrode 7 formed of Pt is formed on the piezoelectric film 6, whereby the piezoelectric element 1 is obtained. The upper electrode 7 can be formed by a sputter method or the like, like the lower electrode 7, In the piezoelectric element 1 thus obtained, the piezoelectric film 6 that is formed of a relaxor material is formed on the seed layer 5 that is preferentially oriented to (100), such that the piezoelectric film is also preferentially oriented excellently to pseudo cubic (100), and therefore has a high piezoelectric constant and exhibits a greater deformation to an applied voltage.

EMBODIMENT EXAMPLE

The piezoelectric layer 1 was fabricated as follows based on a manufacturing method shown in FIGS. 3(a)-(e).

First, a lower electrode 4 formed of Pt with a (111) orientation was formed over a substrate 2 through an elastic film 3 by a sputter method.

Next, a precursor solution of Pb $(Zr_{0.6}Ti_{0.4})O_3$ (=PZT) was prepared as follows.

Metal reagents of lead acetate, zirconium butoxide and titanium isopropoxide were prepared, respectively, and mixed in a molar ratio that corresponds to PZT to be formed, the mixed material was dissolved (dispersed) in butyl cellosolve, and diethanolamine was further added in the solution as a stabilizing agent for the solution, to obtain the precursor solution.

Then, the precursor solution was coated on the lower electrode 4 described above by a spin coat method (precursor solution coating step), a thermal treatment (dry treatment) was then performed at a temperature that was about 10° C. higher than the solvent to thereby remove the solvent (dry thermal treatment step), a heat treatment was performed at about 350° C. to dissolve and remove ligands of the organic metals (cleaning thermal treatment step), and then a rapid thermal anneal (RTA) was performed in an oxygen atmosphere to heat at about 600° C., thereby causing crystallization to form the seed layer 5. The film thickness of the seed layer was 40 nm.

Next, a precursor solution of $(1-x)Pb(Mg_{1/3}Nb_{2/3})O_3-xPbTiO_3$ (=PMN–PT) was prepared as follows.

Metal reagents of lead acetate, titanium isopropoxide, magnesium acetate, and niobium ethoxide were prepared, respectively, and mixed in a molar ratio that corresponds to PMN–PT to be formed, the mixed material was dissolved (dispersed) in butyl cellosolve, and diethanolamine was further added in the solution as a stabilizing agent for the solution, to obtain the precursor solution.

Then, the precursor solution was coated on the seed layer 5 described above by a spin coat method (precursor solution coating step), a thermal treatment (dry treatment) was then performed at a temperature that was about 10° C. higher than the solvent to thereby remove the solvent (dry thermal treatment step), a heat treatment was performed at about 350° C. to dissolve and remove ligands of the organic metals (cleaning thermal treatment step), and then a rapid thermal anneal (RTA) was performed in an oxygen atmosphere to heat at about 600° C., thereby causing crystallization to form the piezoelectric film 6.

Then, an upper electrode 7 formed of Pt was formed on the piezoelectric film 6 by a sputter method, and thus the piezoelectric element 1 was obtained.

The piezoelectric film 6 in the piezoelectric element 1 thus obtained was examined by X-ray diffraction (XRD), and it was confirmed that it was preferentially oriented to (100), and it was further confirmed that it had a rhombohedral structure.

Moreover, the piezoelectric constant ($d_{31}$) of the piezoelectric film 6 was measured, and it was high at 600 pC/N, and the leakage current was less than $10^{-5}$ A/cm² at 100 kV/cm.

Further, the repetition durability of the piezoelectric element 1 was examined when 300 kV/cm was applied, and it was found to be equipped with a high durability that can ensure $10^9$ repetitions.

It is noted here that the seed layer 5 may be composed of a plurality of layers. For example, $PbTiO_3$ may be laminated to a thickness of 5 nm on the Pt electrode for the purpose of improving the (100) orientation of an uppermost surface of the seed layer 5. This is because PZT having Ti-rich composition that would readily have a tetragonal structure would readily take a (001) preferential orientation. The film thickness can be more readily controlled in laminating the $PbTiO_3$ when a sputter method is used rather than a solution coating method. Then, a precursor solution of Pb($Zr_{0.6}Ti_{0.4}$)$O_3$ is coated to a thickness of 40 nm. PZT in this composition range ($Zr_{0.6}Ti_{0.4}$) would likely have a rhombohedral structure, and would likely be preferentially oriented to pseudo cubic (100), when directly disposed on the PZT having a tetragonal structure with a (001) orientation.

Piezoelectric films 6 were made by using relaxor materials shown in "Table" below, and their piezoelectric constants ($d_{31}$) were examined. All of them exhibited high piezoelectric characteristics with $d_{31}$>400 pC/N.

TABLE

| Relaxor material | Piezoelectric constant $d_{31}$ (pC/N) |
|---|---|
| 0.58Pb($Sc_{1/2}Nb_{1/2}$)$O_3$—0.42$PbTiO_3$ | 500 |
| 0.63Pb($In_{1/2}Nb_{1/2}$)$O_3$—0.37$PbTiO_3$ | 400 |
| 0.50Pb($Ga_{1/2}Nb_{1/2}$)$O_3$—0.50$PbTiO_3$ | 400 |
| 0.55Pb($Sc_{1/2}Ta_{1/2}$)$O_3$—0.45$PbTiO_3$ | 400 |
| 0.65Pb($Mg_{1/3}Nb_{2/3}$)$O_3$—0.35$PbTiO_3$ | 600 |
| 0.90Pb($Fe_{1/2}Nb_{1/2}$)$O_3$—0.10$PbTiO_3$ | 400 |
| 0.91Pb($Zn_{1/3}Nb_{2/3}$)$O_3$—0.09$PbTiO_3$ | 600 |
| 0.62Pb($Ni_{1/3}Nb_{2/3}$)$O_3$—0.38$PbTiO_3$ | 500 |
| 0.58Pb($Co_{1/2}W_{1/2}$)$O_3$—0.42$PbTiO_3$ | 400 |

Further, a piezoelectric element 1 using PMN•PT as the piezoelectric film 6, in which a piezoelectric material other than PZT, for example, $BaTiO_3$ was used as the seed layer 5, also exhibited a piezoelectric constant ($d_{31}$) at 600 pC/N.

Ink Jet Recording Head

Figure 4:
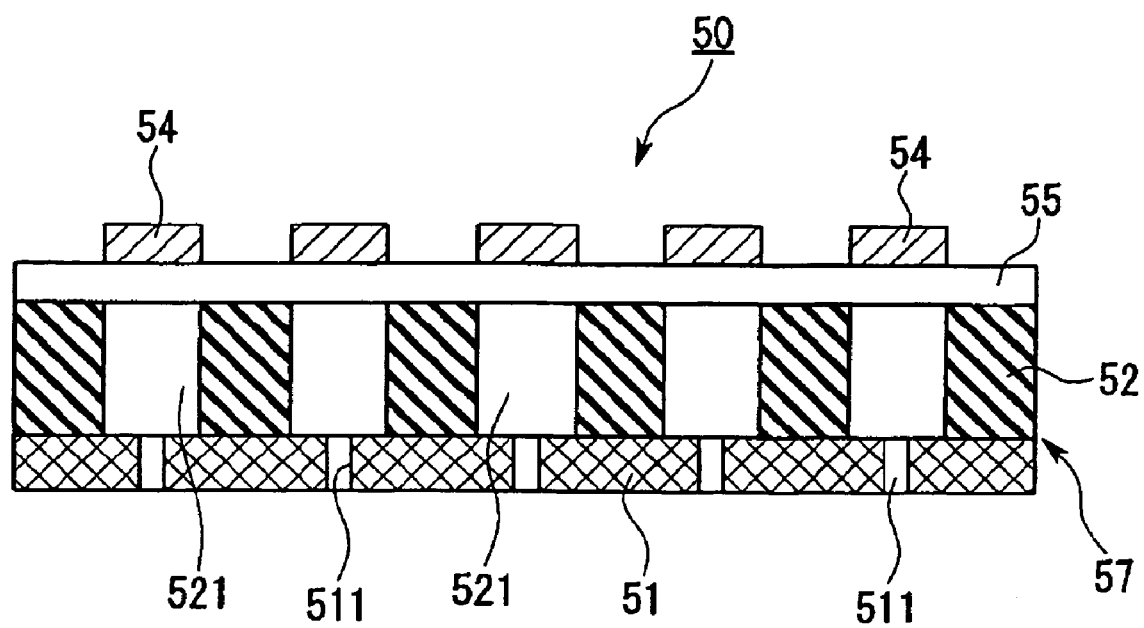
FIG. 4 is a view schematically showing a structure of an ink jet recording head.
Figure 5:
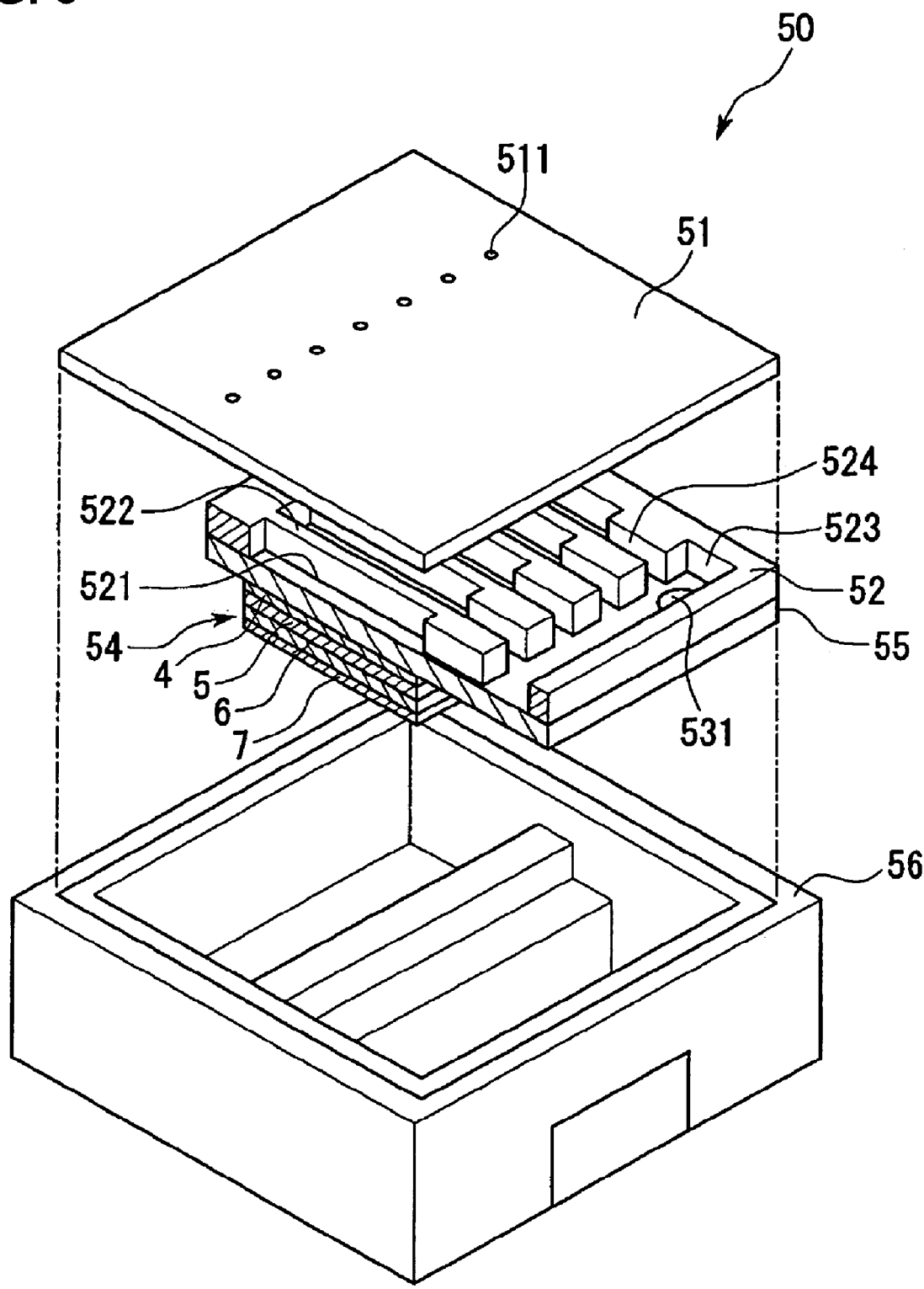
FIG. 5 is an exploded perspective view of the ink jet recording head.

Next, an ink jet recording head using a piezoelectric element shown in FIG. 1 is described. FIG. 4 is a side cross-sectional view schematically showing a structure of an ink jet recording head using the piezoelectric element shown in FIG. 1. FIG. 5 is an exploded perspective view of the ink jet recording head. It is noted that FIG. 4 shows the head upside down with respect to a state in which it is normally used. Reference numeral 50 in these figures denotes an ink jet recording head (hereafter, referred to as the head). The head 50 is equipped with a head main body 57 and piezoelectric elements 54 provided thereon as shown in FIG. 4. The piezoelectric element 54 shown in FIG. 4 is composed of the lower electrode 4, the seed layer 5, the piezoelectric film 6 and the upper electrode 7 of the piezoelectric element 1 shown in FIG. 1 (see FIG. 5), and the elastic film 3 with the aforementioned components formed thereon corresponds to an elastic plate 55. Also, the substrate 2 composes a main portion of the head main body 57 as described below.

More specifically, the head 50 is equipped with a nozzle plate 51, an ink chamber substrate 52, an elastic plate 55, and piezoelectric elements (vibration sources) 54 that are bonded to the elastic plate 55, which are housed in a base substrate 56. The head 50 forms an on-demand type piezoelectric head.

The nozzle plate 51 is formed from, for example, a rolled plate of stainless steel or the like, and includes multiple nozzles 511 formed in a row for jetting ink droplets. The pitch of the nozzles 511 may be appropriately set according to the printing resolution.

The ink chamber substrate 52 is fixedly bonded (affixed) to the nozzle plate 51. The ink chamber substrate 52 is formed from the substrate 2 formed of Si described above, and has a plurality of cavities (ink cavities) 521, a reservoir 523 that temporarily reserves ink that is supplied from an ink cartridge 631, and supply ports 524 that supply the ink from the reservoir 523 to the respective cavities 521, which are defined by the nozzle plate 51, side walls (partition walls) 522 and the elastic plate 55 to be described below.

Each of the cavities 521 is disposed for each of the corresponding nozzles 511 as shown in FIG. 4, has a volume that is variable by vibrations of the elastic plate 55 to be described below, and is formed to eject ink by the volume change.

As a base material for obtaining the ink chamber substrate 52, in other words, as the substrate 2 described above, for example, a silicon single-crystal substrate (Si substrate) with a (110) orientation is used. Because the silicon single-crystal substrate with a (110) orientation is suitable for anisotropic etching, the ink chamber substrate 52 can be readily and securely formed. It is noted that this silicon single-crystal substrate is used with its surface where the elastic film 3 is formed, in other words, its surface where the elastic plate 55 is formed, being a (100) surface.

The average thickness of the ink chamber substrate 52 is not particularly limited, but may preferably be about 10-1000 μm, and more preferably, about 100-500 μm. Also, the volume of the ink chamber 521 is not particularly limited, but may preferably be about 0.1-100 nL, and more preferably, 0.1-10 nL.

The elastic plate 55 is disposed on the ink chamber substrate 52 on the opposite side of the nozzle plate 51, and a plurality of piezoelectric elements 54 are provided on the elastic plate 55 on the opposite side of the ink chamber substrate 52. The elastic plate 55 is formed with the elastic film 3 of the piezoelectric element 1 shown in FIG. 1 described above. A communication hole 531 that penetrates the elastic plate 55 in its thickness direction is formed in the elastic plate 55 at a predetermined position. Ink can be supplied from an ink cartridge 631 to be described below to the reservoir 523 through the communication hole 531.

Each of the piezoelectric elements 54 is structured with the piezoelectric film 6 interposed between the lower electrode 4 and the upper electrode 7, as described above, and disposed in a position corresponding generally to a center portion of each of the cavities 521. Each of the piezoelectric elements 54 is electrically connected to a piezoelectric element driving circuit to be described below, and is structured to operate (vibrate, deform) based on signals of the piezoelectric element driving circuit. In other words, each of the piezoelectric elements 54 functions as a vibration source (head actuator). The elastic plate 55 vibrates (deforms) by vibrations (deformation) of the piezoelectric element 54, and functions to instantaneously increase the inner pressure of the cavity 521.

The base substrate 56 is formed of, for example, any one of various resin materials, any one of metal materials, or the like, and the ink chamber substrate 52 is affixed to and supported by the base substrate 56, as shown in FIG. 4.

Figure 6:
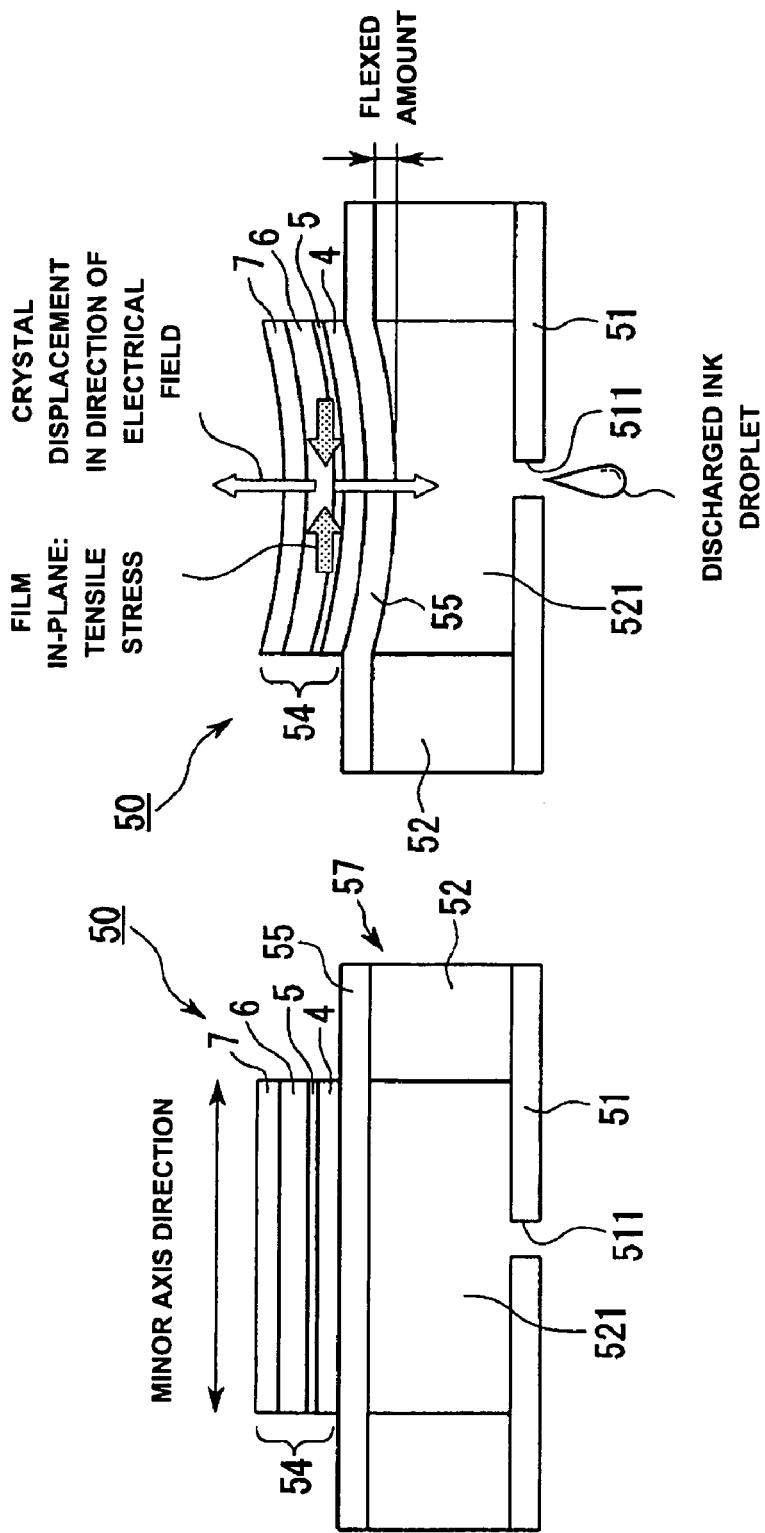
FIGS. 6(a) and (b) are views for describing operations of the head.

In the head 50 having such a structure as described above, in a state in which a predetermined jetting signal is not inputted through the piezoelectric element driving circuit, in other words, in a state in which no voltage is applied across the lower electrode 4 and the upper electrode 6 of the piezoelectric element 54, no deformation occurs in the piezoelectric film 6, as shown in FIG. 6(a). For this reason, no deformation occurs in the elastic plate 55, and no volume change occurs in the cavity 521. Accordingly, no ink droplet is discharged from the nozzle 511.

On the other hand, in a state in which a predetermined jetting signal is inputted through the piezoelectric element driving circuit, in other words, in a state in which a predetermined voltage (for example, about 30V) is applied across the lower electrode 4 and the upper electrode 6 of the piezoelectric element 54, a deflection deformation occurs in the piezoelectric film 6 in its minor axis direction, as shown in FIG. 6(b). By this, the elastic plate 53 flexes by, for example, about 500 nm, thereby causing a change in the volume of the cavity 521. At this moment, the pressure within the cavity 521 instantaneously increases, and an ink droplet is discharged from the nozzle 511.

In other words, when the voltage is impressed, the crystal lattice of the piezoelectric film 6 is extended in a direction perpendicular to its surface, but at the same time compressed in a direction parallel with the surface.

In this condition, a tensile stress works in-plane in the piezoelectric film 6. Therefore, this stress bends and flexes the elastic plate 55. The larger the amount of displacement (in an absolute value) of the piezoelectric film 6 in the direction of the minor axis of the cavity 521, the more the amount of flex of the elastic plate 55 becomes, and the more effectively an ink droplet can be discharged. In the present invention, the piezoelectric constant ($d_{31}$) of the piezoelectric film 6 of the piezoelectric element 54 (1) is high, as described above, and a greater deformation is generated to an impressed voltage, such that the amount of deflection of the elastic plate 55 can be large, and the ink droplet can be discharged more efficiently.

It is noted here that the term "efficiently" implies that an ink droplet in the same amount can be jetted by a smaller voltage. In other words, the driving circuit can be simplified, and at the same time, the power consumption can be reduced, such that the nozzles 511 can be formed at a pitch with a higher density. Alternatively, the length of the major axis of the cavity 521 can be shortened, such that the entire head can be miniaturized.

When one ejection of the ink is completed, the piezoelectric element driving circuit stops application of the voltage across the lower electrode 4 and the upper electrode 7. By this, the piezoelectric element 54 returns to its original shape, such that the volume of the cavity 521 increases. It is noted that, at this moment, a pressure (pressure in a positive direction) works on the ink in a direction from the ink cartridge 631 to be described below toward the nozzle 511. For this reason, air is prevented from entering the ink chamber 521 from the nozzle 511, and an amount of ink matching with the jetting amount of ink is supplied from the ink cartridge 631 through the reservoir 523 to the cavity 521.

In this manner, by inputting jetting signals successively through the piezoelectric element driving circuit to the piezoelectric elements 54 at positions where ink droplets are to be jetted, arbitrary (desired) characters and figures can be printed.

Figure 3:
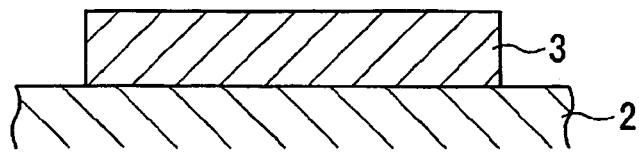
FIGS. 3(a)-(e) are views showing steps of manufacturing a piezoelectric element.
Figure 3:
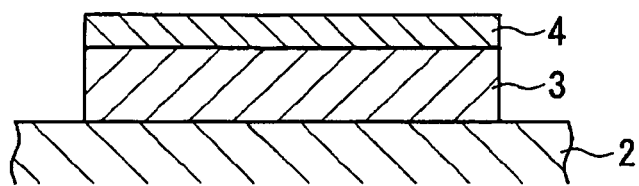
Figure 3:
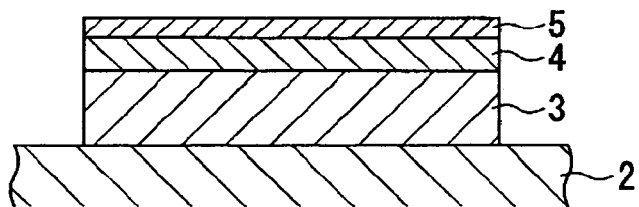
Figure 3:
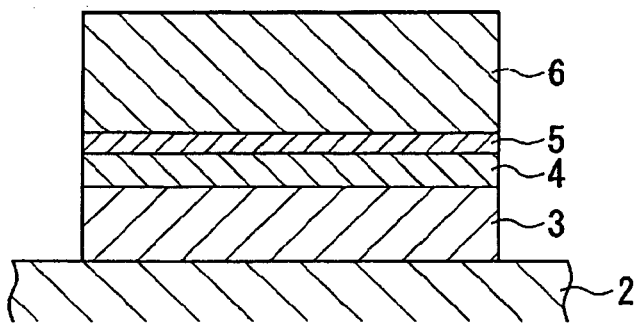
Figure 3:
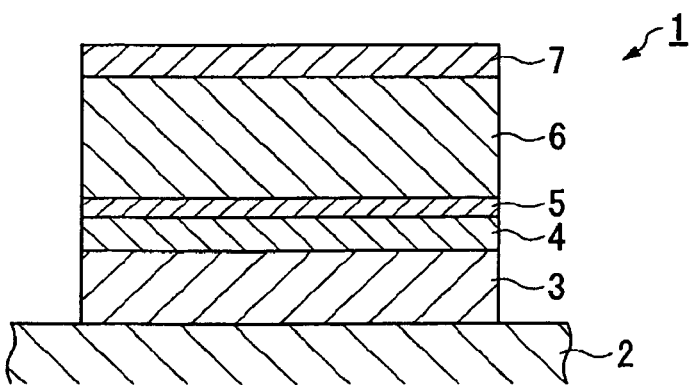

To manufacture the head 50 having such a structure, first, a base material that becomes an ink chamber substrate 52, in other words, a substrate 2 formed of a silicon single-crystal substrate (Si substrate) with a (110) orientation described above, is prepared. Then, an elastic film 3 is formed on the substrate 2 as shown in FIG. 3, and further, a lower electrode 4, a seed layer 5, a piezoelectric film 6, and an upper electrode 7 are successively formed thereon. It is noted that the elastic film 3 formed here becomes the elastic plate 55, as described above.

Next, the upper electrode 7, the piezoelectric film 6, the seed layer 5, and the lower electrode 4 are patterned in a manner to correspond to individual cavities 521 to be formed, thereby forming piezoelectric elements 54 in the number corresponding to the number of the cavities 521, as shown in FIG. 4.

Next, the base material (substrate 2) that becomes an ink chamber plate 52 is processed (patterned), thereby forming concave sections that become the cavities 521 at positions corresponding to the piezoelectric elements 54, and concave sections that become a reservoir 523 and supply ports 524 at predetermined positions.

More specifically, a mask layer that matches with the positions of the ink cavities 521, the reservoir 523 and the supply ports 524 is formed, and then, a dry etching, such as, for example, a parallel flat plate reactive ion etching method, inductive coupled plasma method, electron cyclotron resonance method, helicon wave excitation method, magnetron method, plasma etching method, ion beam etching method, or the like, or a wet etching with a highly concentrated alkaline solution in an amount of about 5 to 40 wt % of potassium hydroxide, tetramethylammonium hydroxide or the like, is conducted.

Here, in particular, when a silicon substrate with a (110) orientation is used as the base material (substrate 2), a wet etching (anisotropic etching) using the highly concentrated alkaline solution described above is preferably used. In this case, in the wet etching with the highly concentrated alkaline solution, the elastic film 3 can function as an etching stopper, and therefore the ink chamber plate 52 can be more readily formed.

In this manner, the base material (substrate 2) is removed by etching in its thickness direction to the extent that the elastic plate 55 (buffer layer 3) is exposed, thereby forming the ink chamber substrate 52. It is noted that, in this instance, portions that remain without being etched become side walls 522, and the elastic film 3 exposed assumes a state that can function as an elastic plate 55.

Next, a nozzle plate 51 formed with a plurality of nozzles 511 is bonded such that each of the nozzles 511 is alighted to correspond to each of the concave sections that become the respective cavities 521. By this, the plurality of cavities 521, the reservoir 523 and the plurality of supply ports 524 are defined. For bonding of the nozzle plate 51, for example, a bonding method using adhesive, a fusing method, or the like can be used.

Next, the ink chamber substrate 52 is attached to the base substrate 56, whereby the ink jet recording head 50 can be obtained.

In the inkjet recording head 50 thus obtained, an efficient discharge is possible because the piezoelectric elements 54 have excellent piezoelectric characteristics, such that the nozzles 511 can be arranged in a higher density, a high density printing and a high-speed printing are enabled, and a further miniaturization of the entire head can be achieved.

Ink Jet Printer

An ink jet printer equipped with the aforementioned ink jet recording head is described. It is noted that the ink jet printer in the present invention includes those for printing on paper or the like, as well as droplet discharge devices for industrial use.

Figure 7:
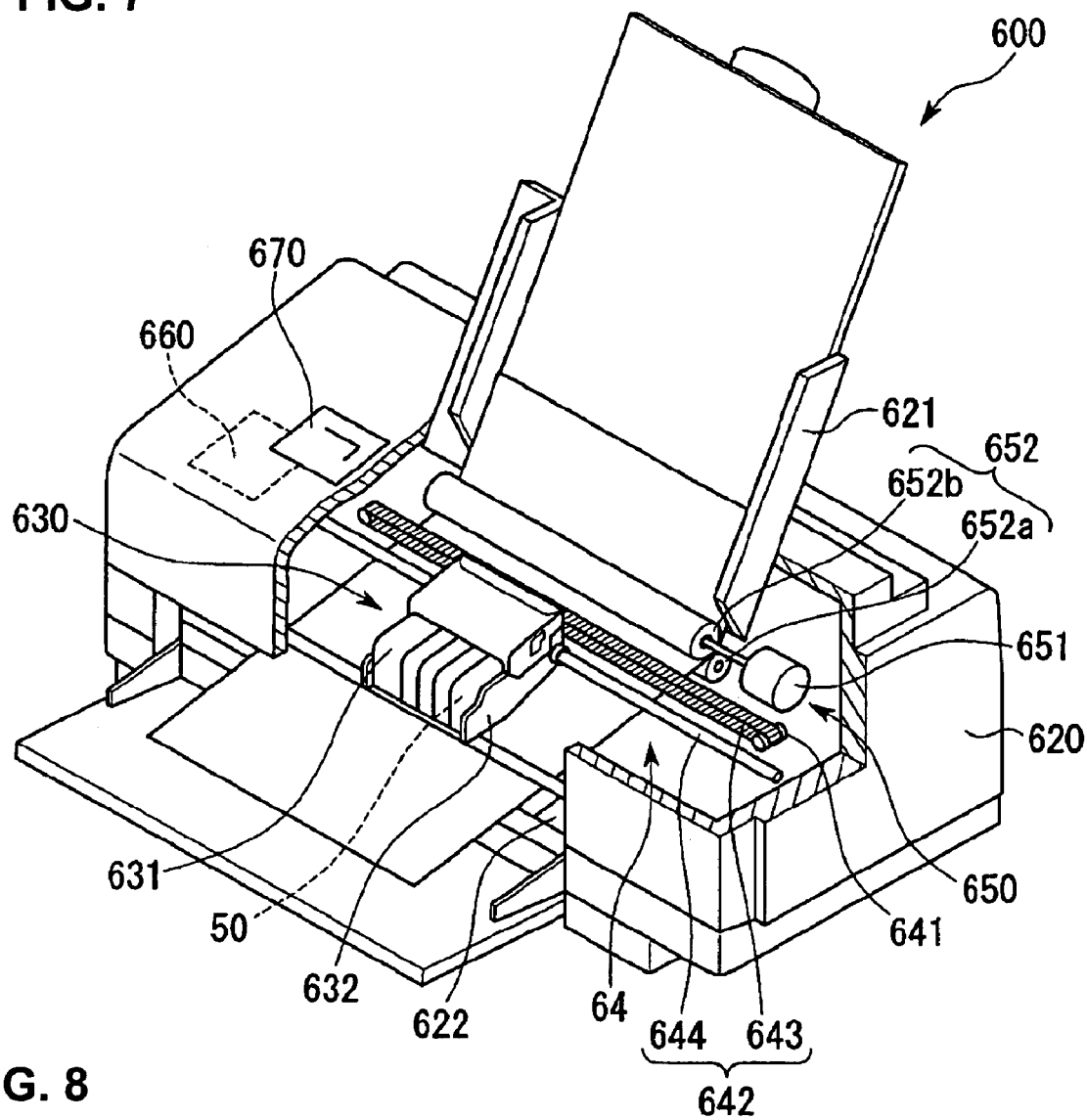
FIG. 7 is a view schematically showing a structure of an ink jet recording in accordance with the present invention.

FIG. 7 is a view schematically showing a structure of an embodiment in which an ink jet printer of the present invention is applied to an ordinary printer for printing on paper or the like, wherein reference numeral 600 in FIG. 7 is an ink jet printer. It is noted that, an upper side in FIG. 7 refers to an "upper section" and a lower side therein refers to a "lower section" in the following descriptions.

The ink jet printer 600 is equipped with an apparatus main body 620, in which a tray 621 for holding recording paper P in an upper rear section thereof, a discharge port 622 for discharging the recording paper P to a lower front section thereof, and an operation panel 670 on an upper surface thereof are provided.

The operation panel 670 is formed from, for example, a liquid crystal display, an organic EL display or an LED lamp, and is equipped with a display section (not shown) for displaying error messages and the like, and an operation section (not shown) composed of various switches and the like.

Also, the apparatus main body 620 is provided on its inside mainly with a printing device 640 having a head unit 630 that can reciprocate, a paper feeding device 650 for feeding recording paper P one by one into the printing device 640, and a control section 660 for controlling the printing device 640 and the paper feeding device 650.

By the control of the control section 660, the paper feeding device 650 intermittently feeds the recording paper P one by one. The recording paper P intermittently fed passes near a lower section of the head unit 630. In this moment, the head unit 630 reciprocally moves in a direction generally perpendicular to a feeding direction of the recording paper P, and prints on the recording paper P. In other words, the reciprocal movements of the head unit 630 and the intermittent feeding of the recording paper P define a main scanning and an auxiliary scanning, respectively, thereby performing printing by an ink jet method.

The printing device 640 is equipped with the head unit 630, a carriage motor 641 that is a driving source for the head unit 630, and a reciprocating mechanism 642 that receives rotations of the carriage motor 641 to reciprocate the head unit 630.

The head unit 630 includes the ink jet recording head 50 equipped with multiple nozzles 511 in its lower section, ink cartridges 631 that supply inks to the ink jet recording head 50, and a carriage 632 on which the ink jet recording head 50 and the ink cartridges 631 are mounted.

It is noted that the ink cartridges 631 that are filled with four colors of yellow, cyan, magenta and black may be used, to enable full-color printing. In this case, the head unit 630 may be provided with the ink jet recording heads 50 corresponding to the respective colors.

The reciprocating mechanism 642 includes a carriage guide shaft 643 having both ends thereof supported by a frame (not shown), and a timing belt 644 that extends in parallel with the carriage guide shaft 643.

The carriage 632 is freely reciprocally supported by the carriage guide shaft 643, and affixed to a portion of the timing belt 644.

By operations of the carriage motor 641, the timing belt 644 is moved in a positive or reverse direction through pulleys, and the head unit 630 reciprocally moves, guided by the carriage guide shaft 643. During these reciprocal movements, the ink is jetted from the ink jet recording head 50, to print on the recording paper P.

The paper feeding device 650 includes a paper feeding motor 651 as its driving source and a paper feeding roller 652 that is rotated by operations of the paper feeding motor 651.

The paper feeding roller 652 is composed of a follower roller 652a and a driving roller 652b that are disposed up and down and opposite each other with a feeding path of the recording paper P (i.e., the recording paper P) being interposed between them, and the driving roller 652b is coupled to the paper feeding motor 651. With such a structure, the paper feeding roller 652 can feed the multiple recording papers P disposed in the tray 621 one by one, toward the printing device 640. It is noted that, instead of the tray 621, a paper feeding cassette for storing recording paper P may be mounted in a freely detachable manner.

The control section 660 is provided for printing by controlling the printing device 640, the paper feeding device 650 and the like, based on print data inputted from a personal computer, a host computer of a digital camera, and the like.

The control section 660 is equipped mainly with a memory that stores control programs and the like to control the respective sections, a piezoelectric element driving circuit that drives the piezoelectric elements (vibration source) 54 and controls ink jetting timings, a driving circuit that drives the printing device 640 (carriage motor 641), a driving circuit that drives the paper feeding device 650 (paper feeding motor 651), a communication circuit that obtains printing data from a host computer, and a CPU that is electrically connected to these circuits, and performs various controls at each of the sections, although none of them are illustrated.

Also, the CPU is electrically connected to various kinds of sensors that can detect the amount of ink remaining in the ink cartridges 631, and printing environments such as the position, temperature, humidity and the like of the head unit 630.

The control section 660 obtains printing data through the communication circuit, and stores the same in the memory. The CPU processes the printing data, and outputs driving signals to the corresponding driving circuits based on the processed data and input data from the variety of sensors. Based on the driving signals, the piezoelectric elements 54, the printing device 640 and the paper feeding device 650 are operated, respectively. By this, desired printing is performed on the recording paper P.

Because the ink jet printer 600 described above is equipped with the ink jet recording head 50 of a high performance which is capable of arranging nozzles at a higher density, as described above, a high density printing and a high-speed printing become possible.

It is noted that the ink jet printer 600 in accordance with the present invention can also be used as a droplet discharge device that is used for industrial purposes, as described above. In this case, as ink (liquid material) to be jetted, a variety of functional materials may be used with their viscosity being adjusted by solvent, dispersion medium or the like.

Furthermore, the piezoelectric element in accordance with the present invention is not only applied to the ink jet recording head 50 and the ink jet printer 600 described above, but also applied to a variety of other devices.

As such devices, a surface acoustic wave element, a frequency filter, an oscillator, an electronic circuit, a thin film piezoelectric resonator, and an electronic apparatus, in accordance with embodiments of the present invention, are described below with reference to the drawings.

Surface Acoustic Wave Element

Figure 8:
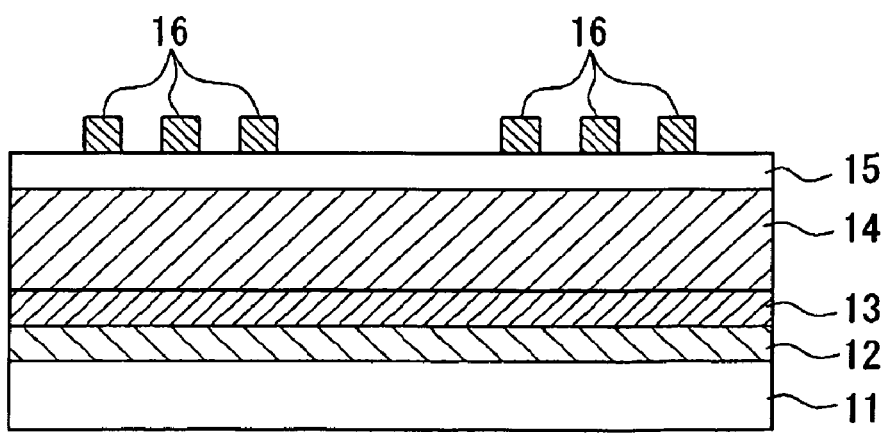
FIG. 8 is a side cross-sectional view of a surface acoustic wave element in accordance with the present invention.

FIG. 8 shows a surface acoustic wave element equipped with a piezoelectric element of the present invention, more specifically, a piezoelectric element having a seed layer 5 and a piezoelectric film 6 shown in FIG. 1 in accordance with an embodiment of the present invention.

Figure 9:
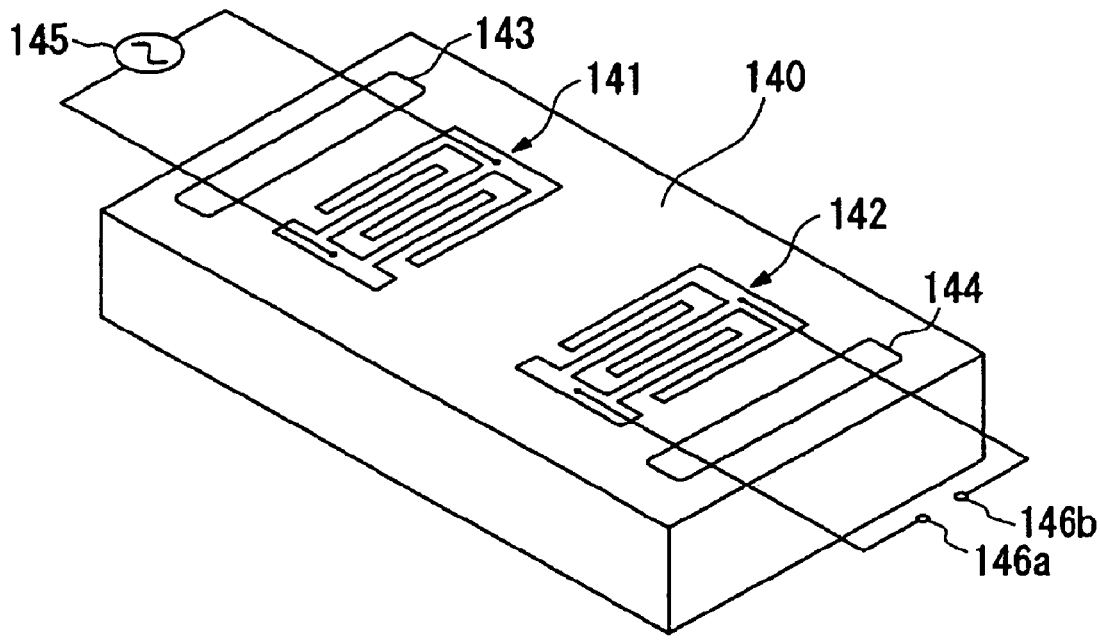
FIG. 9 is a perspective view of a frequency filter in accordance with the present invention.
Figure 10:
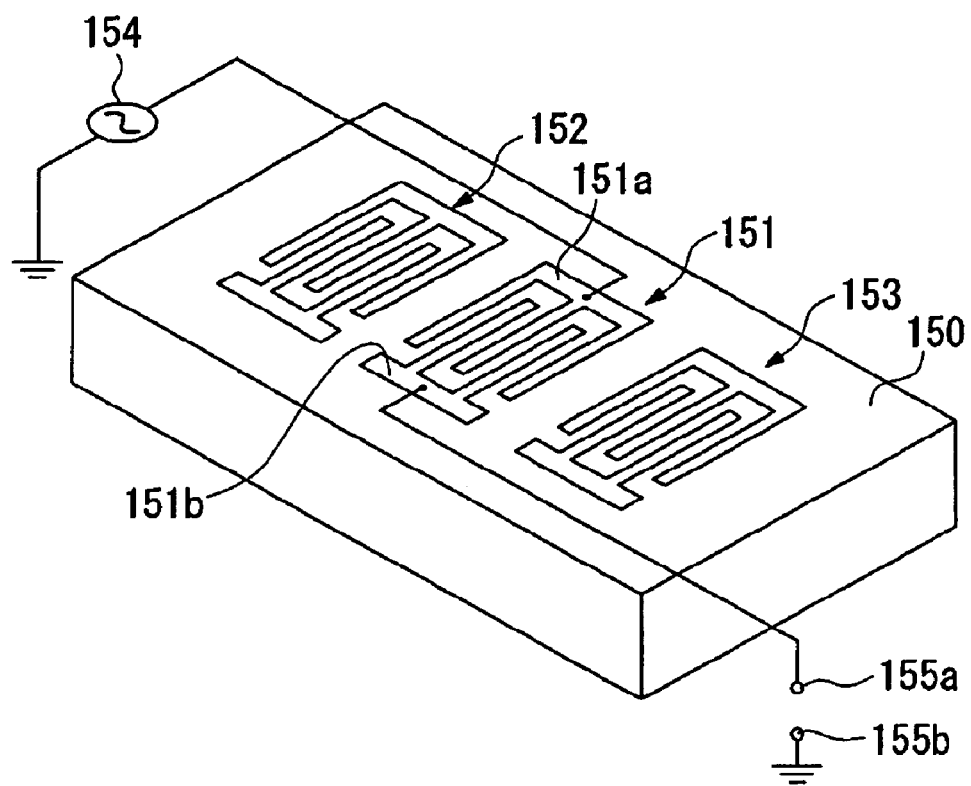
FIG. 10 is a perspective view of an oscillator in accordance with the present invention.

The surface acoustic wave element includes a single-crystal silicon substrate 11, an oxide thin film layer 12, a seed layer 13, a piezoelectric film 14, and a protection layer 15 as a protection film formed of oxide or nitride, and an electrode 16. The electrode 16 is an inter-digital type electrode (Inter-Digital Transducer: hereafter, referred to as "IDT electrode"), and has a configuration, as viewed from above, of an inter-digital transducer 141, 142, 151, 152 or 153, as shown in FIG. 9 and FIG. 10.

To manufacture a surface acoustic wave element having such a structure, first, a (100) single-crystal silicon substrate is prepared as a single-crystal silicon substrate 11.

Next, a thin film of $IrO_2$, $TiO_2$ or the like is formed, for example, by using a laser ablation method on the single-crystal silicon substrate 11, to thereby form an oxide thin film layer 12.

Next, a seed layer 5 is formed by a liquid phase method on the oxide thin film layer 12, like in the case of forming the piezoelectric element 1, and a piezoelectric film 14 is further formed thereon by a liquid phase method.

Next, a $SiO_2$ film is formed by, for example, a laser ablation method on the piezoelectric film 14 as a protection film 15. The protection film 15 protects the piezoelectric film 14 from the atmosphere, and prevents influences by, for example, moisture and impurities in the atmosphere, and at the same time, plays a role to control temperature characteristics of the piezoelectric film 14. The material of the protection film is not limited to $SiO_2$ as long as such purposes are fulfilled.

Then, an aluminum thin film, for example, is formed on the protective layer 15, and then is patterned, thereby forming an electrode 16 having a desired configuration, which is called IDT, to obtain the surface acoustic wave element shown in FIG. 8.

Because the piezoelectric film 14, which is provided in the surface acoustic wave element thus obtained, has excellent piezoelectric characteristic, the surface acoustic wave element itself has a high performance.

Frequency Filter

FIG. 9 shows a frequency filter in accordance with an embodiment of the present invention.

As shown in FIG. 9, the frequency filter has a substrate 140. The substrate 140 uses a substrate with which, for example, the surface acoustic wave element shown in FIG. 8 is formed. More specifically, the substrate includes, on a (100) single-crystal silicon substrate 11, an oxide thin film layer 12, a seed layer 13, a piezoelectric film 14, and a protective layer 15 formed of oxide or nitride as a protection film, laminated in this order.

On the upper surface of the substrate 140, IDT electrodes 141 and 142 are formed. The IDT electrodes 141 and 142 are formed from, for example, Al or an Al alloy, and its thickness is set to about $1/100$ of the pitch of the IDT electrode 141, 142. Moreover, acoustic absorber sections 143 and 144 are formed on the substrate 140 in a manner to interpose the IDT electrodes 141 and 142.

The acoustic absorber sections 143 and 144 absorb surface acoustic waves propagating on the surface of the substrate 140. A high frequency signal source 145 is connected with the IDT electrode 141 formed on the substrate 140, and a signal line is connected with the IDT electrode 142.

When a high frequency signal is outputted from the high frequency signal source 145 in the structure described above, this high frequency signal is impressed on the IDT electrode 141. As a result, surface acoustic waves are generated on the upper surface of the substrate 140. The surface acoustic waves propagate over the top surface of the substrate 140 at a speed of approximately 5000 m/s. The surface acoustic waves propagating from the IDT electrode 141 toward the acoustic absorbing portion 143 are absorbed at the acoustic absorbing portion 143. However, from among the surface acoustic waves propagating toward the IDT electrode 142, only those surface acoustic waves with a specific frequency or specific band frequency determined according to the pitch and the like of the IDT electrode 142 are converted to electric signals, and outputted to terminals 146*a* and 146*b* via the signal line. It is noted that the majority of the frequency components that are not the aforementioned specific frequency or specific band frequency are absorbed by the acoustic absorbing portion 144 after passing through the IDT electrode 142. In this way, of the electric signals supplied to the IDT electrode 141 provided in the frequency filter of the present embodiment, only surface acoustic waves of a specific frequency or specific band frequency can be obtained (i.e., can be filtered).

Oscillator

FIG. 4 shows an oscillator in accordance with an embodiment of the present invention.

As shown in FIG. 4, the oscillator has a substrate 150. As the substrate 150, a substrate with the surface acoustic wave element shown in FIG. 8 formed thereon, for example, is used, like the aforementioned frequency filter. More specifically, the substrate includes, on a (110) single-crystal silicon substrate 11, an oxide thin film layer 12, a seed layer 13, a piezoelectric film 14, and a protection layer 15 as a protection film formed of oxide or nitride, laminated in this order.

On the upper surface of the substrate 150, an IDT electrode 151 is formed. Furthermore, IDT electrodes 152 and 153 are formed in a manner to interpose the IDT electrode 151. The IDT electrodes 151-153 are formed from, for example, Al or an Al alloy, and their thickness is set to about $1/100$ of the pitch of each of the IDT electrodes 151-153, respectively. A high frequency signal source 154 is connected with one of comb teeth-shape electrodes 151*a* composing the IDT electrode 151, and a signal line is connected with the other comb teeth-shape electrode 151*b*. It is noted that this IDT electrode 151 corresponds to an electric signal application electrode, while the IDT electrodes 152 and 153 correspond to resonating electrode for resonating a specific frequency or a specific band frequency of the surface acoustic waves generated by the IDT electrode 151.

When a high frequency signal is outputted from the high frequency signal source 154 in the structure described above, this high frequency signal is impressed on one of the IDT electrode 151, i.e., to the comb teeth-shaped electrode 151a. As a result, surface acoustic waves are generated on the upper surface of substrate 150 that propagate toward the IDT electrode 152 and toward the IDT electrode 153. It is noted that the speed of this surface acoustic waves is approximately 5000 m/s. Of these surface acoustic waves, those surface acoustic waves of a specific frequency component are reflected at the IDT electrodes 152 and 153, and a standing wave is generated between the IDT electrode 152 and the IDT electrode 153. The surface acoustic wave of this specific frequency component is repeatedly reflected at the IDT electrodes 152 and 153. As a result, specific frequency components or specific band frequency components are resonated and their amplitude increases. A portion of the surface acoustic waves of the specific frequency component or the specific band frequency component is extracted from the other of the IDT electrode 151, i.e., the comb teeth-shaped electrode 151b, and the electric signal of the frequency (or the frequency of a certain band) corresponding to the resonance frequency between the IDT electrode 152 and the IDT electrode 153 can be extracted at terminals 155a and 155b.

Figure 11:
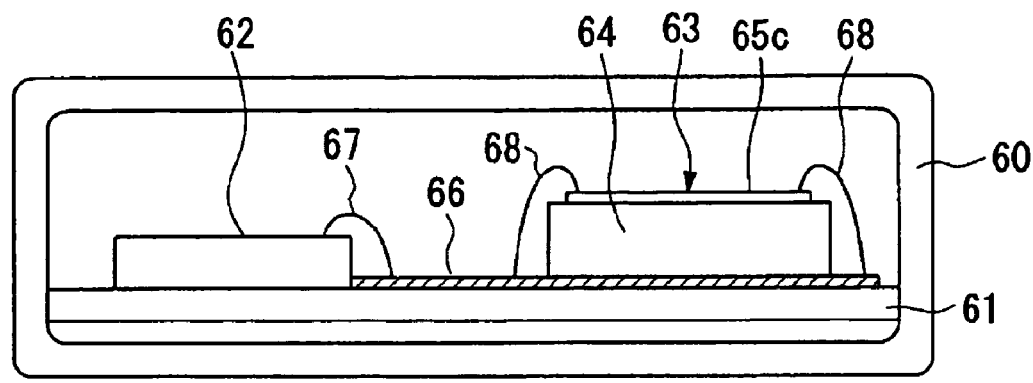
FIG. 11 is a view schematically showing an example in which the oscillator is applied as a VCSO.
Figure 11:
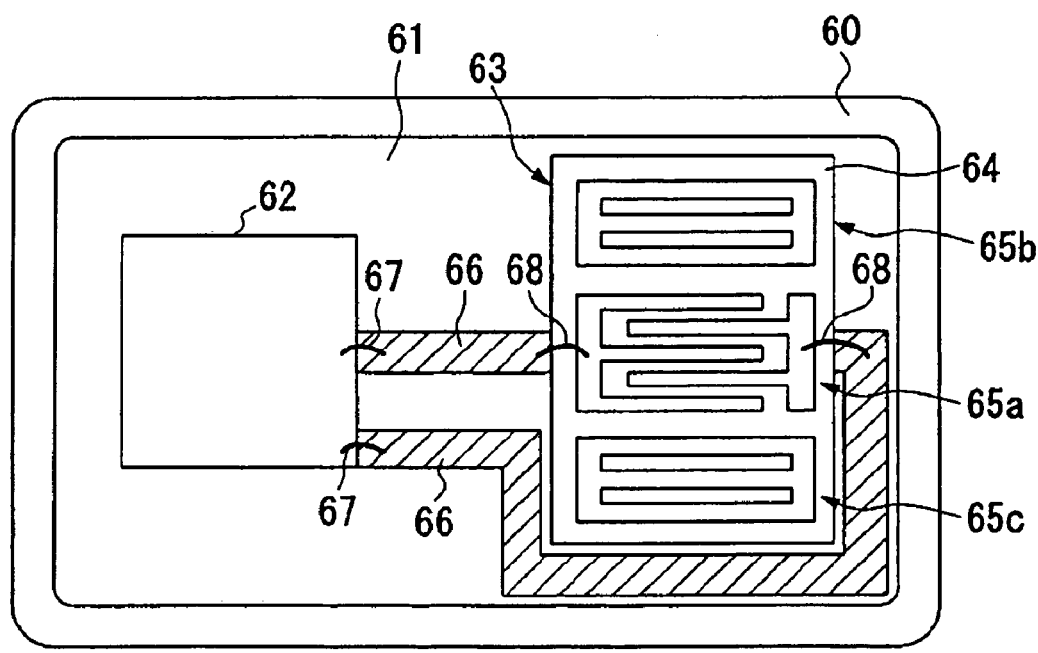

FIG. 11 are views showing an example in which the oscillator (surface acoustic wave element) in accordance with the present invention is employed as a VCSO (Voltage Controlled SAW Oscillator), wherein FIG. 11(a) is a transparent view seen from the side, and FIG. 11(b) is a transparent view seen from above.

The VCSO is housed inside a metallic (aluminum or stainless steel) box 60. On a substrate 61 is mounted an IC (integrated circuit) 62 and an oscillator 63. The IC 62 is an oscillation circuit that controls the frequency impressed on the oscillator 63 in response to a voltage inputted from an external circuit (not shown).

The oscillator 63 includes IDT electrodes 65a-65c formed on top of a substrate 64. This structure is roughly equivalent to the oscillator shown in FIG. 10. It is noted that this substrate 64 includes, on a (100) single-crystal silicon substrate 11, an oxide thin film layer 12, a seed layer 13, a piezoelectric film 14, and a protective layer 15 formed of oxide or nitride as a protection film, laminated in this order, like the aforementioned example shown in FIG. 8.

A wiring 66 is patterned onto the substrate 61 in order to electrically connect the IC 62 and the oscillator 63. The IC 62 and the wiring 66 are, for example, connected by a wire 67 which is a metal wire or the like, and the oscillator 63 and the wiring 66 are connected by a wire 68 which is a metal wire or the like, whereby the IC 62 and the oscillator 63 are electrically connected via the wiring 66.

It is noted that, the VCSO can be formed by integrally forming the IC 62 and the oscillator (surface acoustic wave element) 63 onto the same Si substrate.

Figure 12:
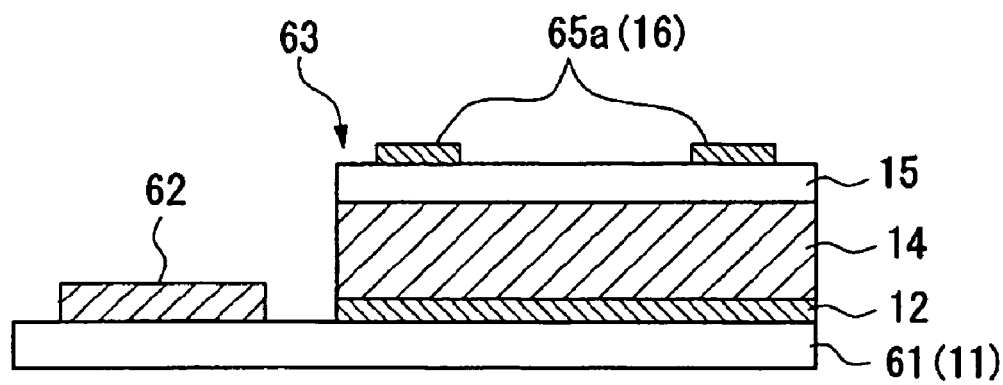
FIG. 12 is a view schematically showing an example in which the oscillator is applied as a VCSO.

FIG. 12 shows a view schematically showing a VCSO in which the IC 62 and the oscillator 63 are integrated. It is noted that the oscillator 63 in FIG. 10 has a structure in which the formation of the second oxide thin film layer 13 is omitted from the surface acoustic wave element shown in FIG. 8.

As shown in FIG. 12, the VCSO is formed in a manner that the IC 62 and the oscillator 63 share a single-crystal silicon substrate 61 (11). The IC 62 and electrodes 65a (16) provided on the oscillator 63 are electrically connected (although not shown). In the present embodiment, TFTs (thin film transistors) are especially adopted as transistors that compose the IC 62.

By using TFTs as transistors that compose the IC 62, in the present embodiment, first, an oscillator 63 (surface acoustic wave element) is formed on a single-crystal silicon substrate 61. Then, TFTs that are formed on a second substrate different from the single-crystal silicon substrate 61 are transferred onto the single-crystal silicon substrate 61, to thereby integrate the TFTs and the oscillator 63. Even if a material is difficult to directly form or unsuitable to form TFTs on the substrate, they can be excellently formed by transfer. Various methods may be used as the transfer method, but in particular, the transfer method described in Japanese Laid-open Patent Application HEI 11-26733 can be preferentially used.

Figure 13:
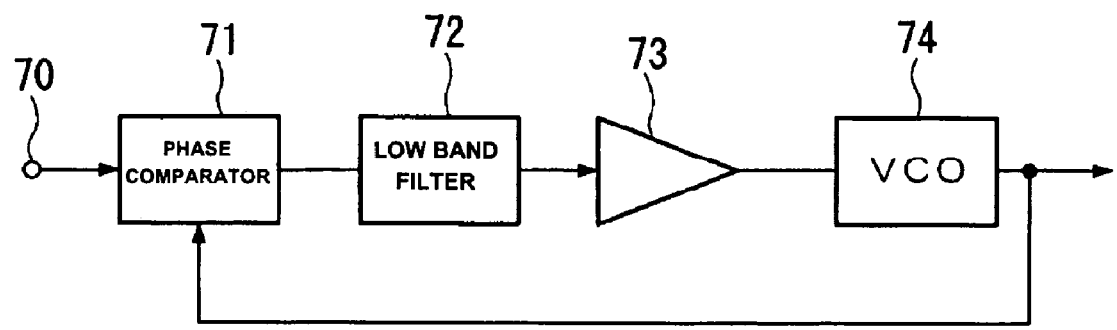
FIG. 13 is a block diagram showing the basic structure of a PLL circuit.

The VCSO shown in FIG. 11 and FIG. 12 can be employed as a VCO (Voltage Controlled Oscillator) for a PLL circuit shown in FIG. 13, for example. The PLL circuit is briefly explained below.

FIG. 13 is a block diagram showing the basic structure of a PLL circuit. As shown in FIG. 13, the PLL circuit includes a phase comparator 71, a low band filter 72, an amplifier 73 and a VCO 74.

The phase comparator 71 compares the phase (or frequency) of the signal inputted from an input terminal 70 and the phase (or frequency) of the signal outputted from the VCO 74, and outputs an error voltage signal, the value of which is set according to the difference between the aforementioned signals. The low band filter 72 transmits only the low frequency components at the position of the error voltage signal outputted from the phase comparator 71, and the amplifier 73 amplifies the signal outputted from the low band filter 72. The VCO 74 is an oscillator circuit in which the oscillation frequency is continuously changed within a certain range, corresponding to the voltage value inputted.

The PLL circuit having such a structure operates so as to decrease the difference between the phase (or frequency) inputted from the input terminal 70 and the phase (or frequency) of the signal outputted from the VCO 74, and synchronizes the frequency of the signal outputted from the VCO 74 with the frequency of the signal inputted from the input terminal 70. When the frequency of the signal outputted from the VCO 74 is synchronized with the frequency of the signal inputted from the input terminal 70, it matches with the signal inputted from the input terminal 70 after excluding a specific phase difference, and a signal which conforms to the changes in the input signal is outputted.

Electronic Circuit and Electronic Apparatus

Figure 14:
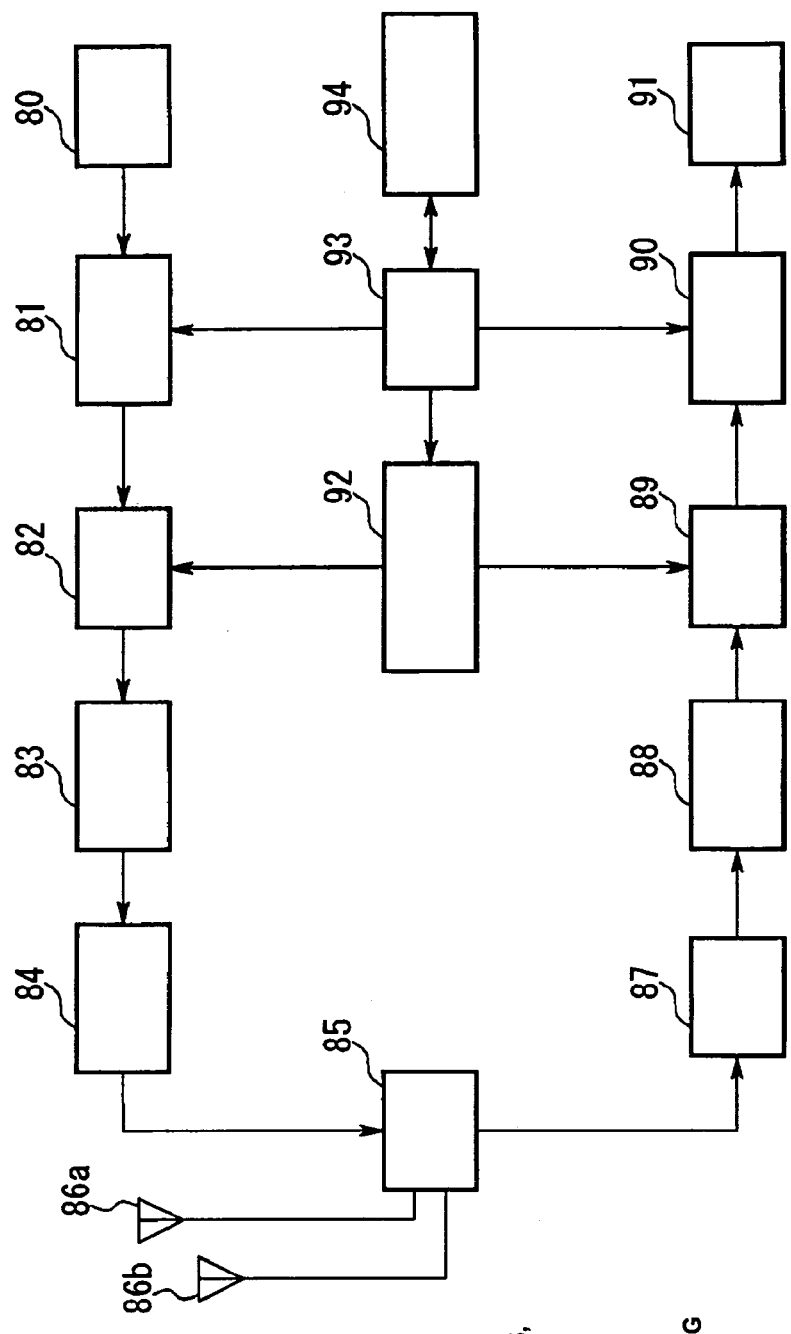
FIG. 14 is a block diagram showing the structure of an electronic circuit in accordance with the present invention.

FIG. 14 is a block diagram showing an electrical structure of an electronic circuit in accordance with an embodiment of the present invention. It is noted that the electronic circuit in FIG. 14 is a circuit that is provided inside a cellular telephone 100 shown in FIG. 15, for example. The cellular telephone 100 shown in FIG. 15 is an example of an electronic apparatus in accordance with the present invention, and includes an antenna 101, a receiver 102, a transmitter 103, a liquid crystal display 104, and operating buttons 105, and the like.

The electronic circuit shown in FIG. 14 has the basic structure of an electronic circuit provided inside the cellular telephone 100, and is equipped with a transmitter 80, a transmission signal processing circuit 81, a transmission mixer 82, a transmission filter 83, a transmission power amplifier 84, a transceiver wave divider 85, antennas 86a, 86b, a low noise amplifier 87, a reception filter 88, a reception mixer 89, a reception signal processing circuit 90, a receiver 91, a frequency synthesizer 92, a control circuit 93, and an input/display circuit 94. It is noted that the cellular telephones currently in use have a more complicated circuit structure due to the fact that they perform frequency converting processes multiple times.

Figure 15:
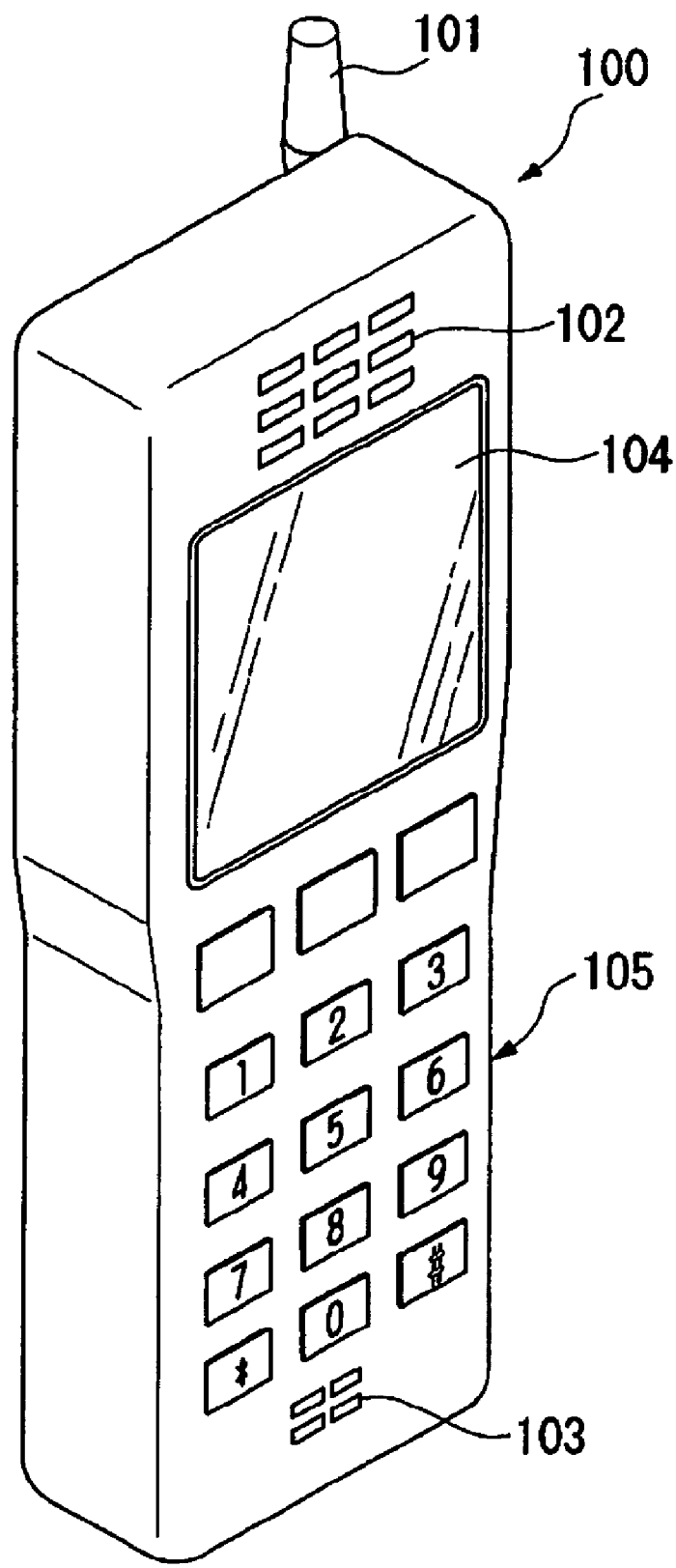
FIG. 15 is a perspective view showing a cellular telephone as one type of electronic device according to an embodiment of the present invention.

The transmitter 80 can be realized with a microphone which converts sound wave signals into electric signals, for example, and may correspond to the transmitter 103 in the cellular telephone 100 shown in FIG. 15. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. It is noted that the frequency of the signal supplied to the transmission mixer 82 is about 380 MHz, for example. The transmission filter 83 permits passage of only those signals of the required frequency from among the intermediate frequencies (hereafter referred to as "IF"), and cuts unnecessary frequency signals. It is noted that the signal outputted from the transmission filter 83 is converted to an RF signal by a converting circuit not shown in the figures. The frequency of this RF signal is about 1.9 GHz, for example. The transmission power amplifier 84 amplifies the power of the RF signal outputted from the transmission filter 83 and outputs this amplified result to the transceiver wave divider 85.

The transceiver wave divider 85 outputs the RF signal outputted from the transmission power amplifier 84 to the antennas 86a and 86b, and transmits the signal in the form of radio waves from the antennas 86a and 86b. Also, the transceiver wave divider 85 divides the reception signal received by the antennas 86a and 86b, and outputs the result to the low noise amplifier 87. It is noted that the frequency of the reception signal outputted from the transceiver wave divider 85 is, for example, around 2.1 GHz. The low noise amplifier 87 amplifies the reception signal from the transceiver wave divider 85. It is noted that the signal outputted from the low noise amplifier 87 is converted to an intermediate signal (IF) by a converting circuit not shown in the figures.

The reception filter 88 permits passage of only those signals of the required frequency from among the intermediate frequencies (IF) that were converted by a converting circuit not shown in the figures, and cuts unnecessary frequency signals. The reception mixer 89 employs the signal outputted from the frequency synthesizer 92 to mix the signals outputted from the transmission signal processing circuit 81. It is noted that the intermediate frequency supplied to the reception mixer 89 is, for example, around 190 MHz. The reception signal processing circuit 90 performs such processing as A/D conversion, modulation, etc., to the signal outputted from the reception mixer 89. The receiver 91 is realized by means of a small speaker which converts electric signals into sound waves, for example, and corresponds to the receiver 102 in the cellular telephone 100 shown in FIG. 17.

The frequency synthesizer 92 is a circuit for generating the signal (at a frequency of 380 MHz, for example) to be supplied to the transmission mixer 82 and the signal (at a frequency of 190 MHz, for example) to be supplied to the reception mixer 89. The frequency synthesizer 92 is equipped with a PLL circuit for generating a signal at 760 MHz, for example. The frequency synthesizer 92 divides the signal output from this PLL circuit and generates a 380 MHz frequency signal, for example, and then further divides this signal to generate a 190 MHz signal. The control circuit 93 controls the transmission signal processing circuit 81, the reception signal processing circuit 90, the frequency synthesizer 92, and the input/display circuit 94, thereby controlling the overall operation of the cellular telephone. The input/display circuit 94 displays the device status to the user of the cellular telephone 100 shown in FIG. 15, and is provided for the user to input directions. This input/display circuit 94 corresponds, for example, to the liquid crystal display 104 and the operating buttons 105 on the cellular telephone 100.

In an electronic circuit of the above-described structure, the frequency filter shown in FIG. 9 is employed as the transmission filter 83 and the reception filter 88. The frequency that is filtered (i.e., the frequency which is, permitted to pass through the filter) is set separately at the transmission filter 83 and the reception filter 88 in response to the required frequency in the signal outputted from the transmission mixer 82 and the required frequency at the reception mixer 89. The PLL circuit that is provided within the frequency synthesizer 92 is provided with the oscillator shown in FIG. 11 or the oscillator (VCSO) shown in FIG. 12 as the VCO 74 of the PLL circuit shown in FIG. 11.

Thin Film Piezoelectric Resonator

Figure 16:
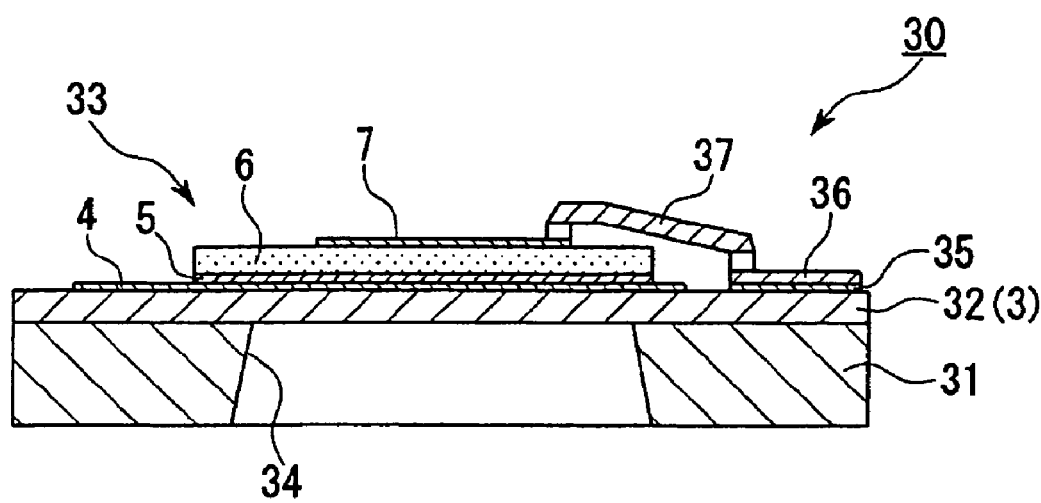
FIG. 16 is a side cross-sectional view showing a thin film piezoelectric resonator in accordance with the present invention.

FIG. 16 shows a thin film piezoelectric resonator in accordance with an embodiment of the present invention. Reference numeral 30 in FIG. 16 denotes a thin film piezoelectric resonator of a diaphragm type, particularly used as a communication device and a communication filter. The thin film piezoelectric resonator 30 includes a resonator 33 formed through an elastic plate 32 over a base substrate 31 formed of a single-crystal silicon substrate.

The base substrate 31 is formed of a single-crystal silicon substrate having a thickness of about 200 μm with a (110) orientation, and defines, on its bottom surface side (on the opposite side of the resonator 32), a via hole 34 penetrating from the bottom surface side to an upper surface side of the base substrate 31.

The elastic plate 32 is formed with the elastic film 3 in the piezoelectric element 1 shown in FIG. 1 in the present embodiment, and is formed on a (110) surface of the base substrate 31. Moreover, the resonator 33 is formed with the lower electrode 4, the seed layer 5, the piezoelectric film 6, and the upper electrode 7 in the piezoelectric element 1 shown in FIG. 1. The thin film piezoelectric resonator 30 thus composed has a structure in which the main portion (except the base substrate 2) of the piezoelectric element 1 shown in FIG. 1 is formed as is on the base substrate 31.

It is noted that the elastic plate 32 can be formed as follows. For example, silicon nitride (SiN) is formed to a thickness of about 200 nm on the base substrate 31, then silicon dioxide ($SiO_2$) is formed thereon to a thickness of about 400 nm to 3 μm, and the elastic film 3 is formed on them, such that the laminated films of silicon nitride, silicon dioxide and elastic film 3 can be used as the elastic plate 32. Alternatively, when silicon nitride and silicon dioxide films are formed on the base substrate 2, the elastic film 3 may not be formed, such that the elastic plate 32 can be formed with only these laminated films.

The lower electrode 4 is formed of Pt with a (111) orientation, and is thickly formed to a thickness of about 200 nm.

The seed layer 5 is formed of a perovskite type piezoelectric material, and is preferentially oriented to (100). More specifically, it is formed of PZT or the like, and is formed to a thickness of 0.1 μm or less.

The piezoelectric film 6 is formed of a relaxor material that has a rhombohedral structure of a perovskite type, and preferentially oriented to pseudo cubic (100), and is formed to a thickness of about 0.9 μm.

The upper electrode 7 is formed of Pt, like the lower electrode 4. However, the upper electrode 7 is thickly formed to a thickness of about 700 nm in the present embodiment.

The upper electrode 7 is provided with a wiring 37 formed of gold or the like through a pad 36, for electrically connecting to an electrode 35 formed on the elastic plate 32.

To manufacture the thin film piezoelectric resonator 30 having such a structure, first, a base material that becomes the base substrate 31, in other words, a silicon single-crystal substrate (Si substrate) with a (110) orientation described above, is prepared. Then, an elastic plate 3 is formed on the Si substrate, and further, a lower electrode 4, a seed layer 5, a piezoelectric film 6, and an upper electrode 7 are successively formed thereon. When the laminated films of silicon nitride, silicon dioxide and buffer layer are used as the elastic plate 32, silicon nitride and silicon dioxide are formed in this order on the Si substrate prior to forming the elastic film 3.

Then, the upper electrode 7, the piezoelectric film 6, the seed layer 5, and the lower electrode 4 are patterned so as to correspond to the via hole 34 to be formed, thereby forming the resonator 33. It is noted that, in particular, when the lower electrode 4 is to be patterned, the electrode 35 is also formed at the same time, separately from the lower electrode 4, as shown in FIG. 16.

Then, the single-crystal silicon substrate is processed (patterned) by etching or the like from its bottom side, to form the via hole 34 that penetrates the substrate.

Then, a pad 36 and a wiring 37 for connecting the upper electrode 7 and the electrode 35 are formed, thereby obtaining the thin film piezoelectric resonator 30.

Because the piezoelectric film of the resonator has excellent piezoelectric characteristics and therefore has a high electromechanical coupling factor, the thin film piezoelectric resonator 30 thus obtained can be used in a high-frequency area, such as, for example, a GHz band, and can excellently function despite its smallness (thinness).

Figure 17:
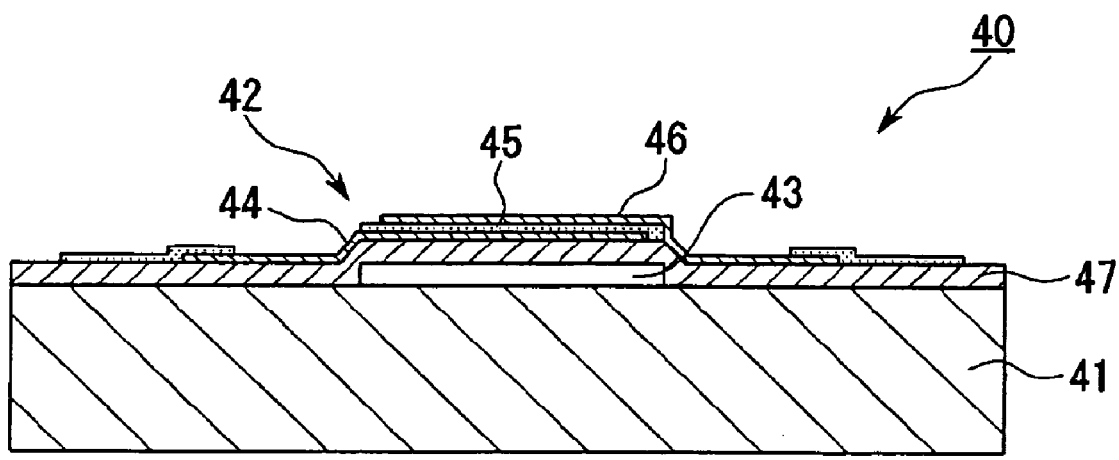
FIG. 17 is a side cross-sectional view showing a thin film piezoelectric resonator in accordance with the present invention.

FIG. 17 shows a thin film piezoelectric resonator in accordance with another embodiment of the present invention. Reference numeral 40 in FIG. 17 denotes a thin film piezoelectric resonator. The thin film piezoelectric resonator 40 is different mainly from the thin film piezoelectric resonator 30 shown in FIG. 16 in that a via hole is not formed, but an air gap 43 is formed between the base substrate 41 and the resonator 42.

More specifically, the thin film piezoelectric resonator 40 includes a resonator 42 formed over a base substrate 41 formed of a single-crystal silicon substrate with a (110) orientation. The resonator 42 is formed with a lower electrode 44, a piezoelectric material layer 45 formed of a seed layer and piezoelectric film, and an upper electrode 46, which consist of the same materials as those of the lower electrode 4, the seed layer 5, the piezoelectric film 6, and the upper electrode 7 described above, and, in particular, the resonator 42 is formed by laminating the lower electrode 44, the piezoelectric material layer 45 and the upper electrode 46 over the air gap 43.

In the present embodiment, an elastic film 3 is formed in a state to cover the air gap 43 on the lower side of the lower electrode 44, wherein the elastic film 3 defines an elastic plate 47 like the aforementioned example.

The elastic plate 47 can also be formed as follows. Like the aforementioned example, on the base substrate 41 may be formed layers of silicon nitride and silicon dioxide, or only silicon dioxide may be formed, and then the elastic film 3 is formed on them, such that these laminated layers define the elastic plate 47. Alternatively, the elastic plate 47 may be formed with laminated layers of silicon nitride and silicon dioxide, or only silicon dioxide, without forming the elastic film 3.

To manufacture the thin film piezoelectric resonator 40 having such a structure, first, a film of germanium (Ge), for example, is formed by vapor deposition or the like on the base substrate 41, and is then patterned in the same shape as the shape of an air gap, thereby forming, a sacrificial layer.

Then, an elastic film 3 covering the sacrificial layer is formed. It is noted that, prior to this, layers of silicon nitride and silicon dioxide may be formed, or only a layer of silicon dioxide may be formed. Then, these buffer layers may be patterned in a desired shape.

Next, a layer covering the elastic film 3, which becomes to be a lower electrode 44, is formed, and then it is patterned by dry etching or the like, thereby forming the lower electrode 44.

Then, a seed layer and a piezoelectric film covering the lower electrode 44 are formed in this order, thereby forming layers with these laminated layers that become a piezoelectric material layer 45. Then, the layers are patterned by dry etching or the like, to form the piezoelectric material layer 45.

Then, a layer covering the piezoelectric material layer 45, which becomes to be an upper electrode 46, is formed, and then it is patterned by dry etching or the like, thereby forming the upper electrode 46. It is noted that, when the elastic film 3, the lower electrode 44, the piezoelectric material layer 45 and the upper electrode 46 are formed by patterning over the sacrificial layer in this manner, a portion of the sacrificial layer is exposed externally.

Then, the above-described sacrificial layer is etched and removed from the base substrate 41 by, for example, hydrogen peroxide solution ($H_2O_2$), thereby forming the air gap 43, whereby the thin film piezoelectric resonator 40 is obtained.

Because the piezoelectric film of the resonator has excellent piezoelectric characteristics and therefore has a high electromechanical coupling factor, the thin film piezoelectric resonator 40 thus obtained can be used in a high-frequency area, such as, for example, a GHz band, and can excellently function despite its smallness (thinness).

Also, when appropriately combined with circuit composing elements such as inductances, capacitors and the like, the above-described thin film piezoelectric resonator 30 or 40 composes an excellent induction filter.

The surface acoustic wave element, frequency filter, oscillator, electronic circuit, thin film piezoelectric resonator and electronic apparatus (cellular telephone 100) in accordance with the embodiments of the present invention were explained above. However, the present invention is not limited to the above-described embodiments, but rather a variety of modifications may be freely made within the scope of the invention.

For example, the preceding embodiments were explained using a cellular telephone as an example of an electronic apparatus and an electronic circuit provided inside the cellular telephone as an example of an electronic circuit. However, the present invention is not limited to a cellular telephone, and may be applied to a variety of mobile communications devices and their internal electronic circuits.

Furthermore, the present invention is not limited to mobile communications devices, but may also be applied to communications devices used in a stationary state such as tuners for receiving BS and CS transmissions, and their internal electronic circuits provided therein. Moreover, the present invention is neither limited to communications devices employing radio waves propagating through air as the communications carrier, but may also be applied to electronic devices and their internal circuitry, such as HUB, which employ high-frequency signals propagating through a co-axial cable or optical signals propagating through an optical cable.

What is claimed is:

1. A piezoelectric element comprising:
a seed layer formed on a base substrate; and
a piezoelectric film formed on the seed layer,
wherein the seed layer is formed of a first perovskite type material whose orientation is oriented to pseudo cubic (100), the first perovskite type material being a piezoelectric material;
the piezoelectric film is formed of a second perovskite type material oriented to pseudo cubic (100); and
the seed layer is formed of $Pb(ZrTi)O_3$.

2. A piezoelectric element comprising:
a seed layer formed on a base substrate; and
a piezoelectric film formed on the seed layer,
wherein the seed layer is formed of a first perovskite type material oriented to pseudo cubic (100), the first perovskite type material being a piezoelectric material;
the piezoelectric film is formed of a second perovskite type material having a rhombohedral structure oriented to pseudo cubic (100), the second perovskite type material being a relaxor material; and
the seed layer is formed of $Pb(ZrTi)O_3$.

3. A piezoelectric element comprising:
a seed layer formed on a base substrate; and
a piezoelectric film formed on the seed layer,
wherein the seed layer is formed of a first perovskite type material whose orientation is oriented to pseudo cubic (100), the first perovskite type material being a piezoelectric material;
the piezoelectric film is formed of a second perovskite type material oriented to pseudo cubic (100), the second perovskite type material being a relaxor material;
the seed layer is formed of $Pb(ZrTi)O_3$; and
the seed layer includes a plurality of layers, and a composition of each layer among the plurality of layers is different from one another.

4. A piezoelectric element comprising:
a seed layer formed on a base substrate; and
a piezoelectric film formed on the seed layer,
wherein the seed layer is formed of a first perovskite type material oriented to pseudo cubic (100), the first perovskite type material being a piezoelectric material;
the piezoelectric film is formed of a second perovskite type material having a rhombohedral structure oriented to pseudo cubic (100), the second perovskite type material being a relaxor material; and
the seed layer includes a plurality of layers, and a composition of each layer among the plurality of layers is different from one another.

5. A piezoelectric element according to claim 1, wherein the second perovskite type material is formed of at least one material shown by formulae as follows:

$(1-x)Pb(Sc_{1/2}Nb_{1/2})O_3\text{-}xPbTiO_3$ (where, x is 0.10<x<0.42);

$(1-x)Pb(In_{1/2}Nb_{1/2})O_3\text{-}xPbTiO_3$ (where, x is 0.10<x<0.37);

$(1-x)Pb(Ga_{1/2}Nb_{1/2})O_3\text{-}xPbTiO_3$ (where, x is 0.10<x<0.50);

$(1-x)Pb(Sc_{1/2}Ta_{1/2})O_3\text{-}xPbTiO_3$ (where, x is 0.10<x<0.45);

$(1-x)Pb(Mg_{1/3}Nb_{2/3})O_3\text{-}xPbTiO_3$ (where, x is 0.10<x<0.35);

$(1-x)Pb(Fe_{1/2}Nb_{1/2})O_3\text{-}xPbTiO_3$ (where, x is 0.01<x<0.10);

$(1-x)Pb(Zn_{1/3}Nb_{2/3})O_3\text{-}xPbTiO_3$ (where, x is 0.01<x<0.09);

$(1-x)Pb(Ni_{1/3}Nb_{2/3})O_3\text{-}xPbTiO_3$ (where, x is 0.10<x<0.38);

$(1-x)Pb(Co_{1/2}W_{1/2})O_3\text{-}xPbTiO_3$ (where, x is 0.10<x<0.42).

6. A piezoelectric element according to claim 1, wherein the piezoelectric element, in an ink jet recording head equipped with a cavity having a volume that changes, changes the volume of the cavity by a deformation of the piezoelectric film.

7. A piezoelectric actuator equipped with the piezoelectric element according to claim 1.

8. An ink jet recording head equipped with a cavity having a volume that changes, comprising the piezoelectric element according to claim 1 as a piezoelectric element that changes the volume of the cavity by a deformation of a piezoelectric film.

9. An ink jet printer comprising the ink jet recording head according to claim 8.

10. The piezoelectric element according to claim 1, the second perovskite material being formed of a relaxor material.

* * * * *